United States Patent
Miller et al.

(10) Patent No.: US 7,602,119 B2
(45) Date of Patent: Oct. 13, 2009

(54) OLED WITH MAGENTA AND GREEN EMISSIVE LAYERS

(75) Inventors: Michael E. Miller, Honeoye Falls, NY (US); Jeffrey P. Spindler, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 700 days.

(21) Appl. No.: 11/315,827

(22) Filed: Dec. 22, 2005

(65) Prior Publication Data

US 2006/0238120 A1 Oct. 26, 2006

Related U.S. Application Data

(63) Continuation-in-part of application No. 11/113,484, filed on Apr. 25, 2005, now Pat. No. 7,471,041, and a continuation-in-part of application No. 11/113,915, filed on Apr. 25, 2005.

(51) Int. Cl.
*H05B 33/00* (2006.01)

(52) U.S. Cl. .................. 313/506; 313/504; 345/82; 345/76; 428/690

(58) Field of Classification Search .................. 313/506
See application file for complete search history.

(56) References Cited

U.S. PATENT DOCUMENTS

| | | | |
|---|---|---|---|
| 4,800,375 A | 1/1989 | Silverstein et al. | |
| 5,113,274 A | 5/1992 | Takahashi et al. | |
| 5,276,380 A | 1/1994 | Tang | |
| 5,550,066 A | 8/1996 | Tang et al. | |
| 6,570,584 B1 | 5/2003 | Cok et al. | |
| 6,693,611 B1 | 2/2004 | Burroughes | |
| 6,872,472 B2 * | 3/2005 | Liao et al. | 428/690 |
| 7,142,179 B2 * | 11/2006 | Miller et al. | 345/76 |
| 7,436,113 B2 * | 10/2008 | Spindler | 313/504 |
| 7,439,670 B2 * | 10/2008 | Winters et al. | 313/504 |
| 2001/0043043 A1 | 11/2001 | Aoyama et al. | |
| 2002/0186214 A1 | 12/2002 | Siwinski | |

(Continued)

FOREIGN PATENT DOCUMENTS

KR   2005-0031888   4/2005

OTHER PUBLICATIONS

S. Tasch et al., The Application of Poly(Phenylene) Type Polymers and Oligomers in Electroluminescent Color Displays, Materials Research Society Symposium Proceedings, Materials Research Society, Pittsburg, PA, US, vol. 471, 1997, pp. 325-330, XP000979688.

*Primary Examiner*—Sikha Roy
(74) *Attorney, Agent, or Firm*—Raymond L. Owens

(57) ABSTRACT

It is an object of the present invention to avoid the above-mentioned problems and provide a multicolor OLED display with improved power efficiency that reduces the need for precisely patterning one or more of the OLED layers. This object is achieved by an OLED display having at least red, green, and blue colored pixels, including a magenta light emitting layer provided over a substrate for red and blue pixels and a green light emitting layer provided over the substrate for producing at least a green pixel. It is also achieved by first and second color filters in operative relationship with the magenta light-emitting layer to respectively produce red and blue pixels.

12 Claims, 12 Drawing Sheets

U.S. PATENT DOCUMENTS

| | | |
|---|---|---|
| 2002/0191130 A1 | 12/2002 | Liang et al. |
| 2003/0170491 A1 | 9/2003 | Liao et al. |
| 2005/0045917 A1 | 3/2005 | Yamazaki et al. |
| 2005/0073230 A1 | 4/2005 | Nishikawa et al. |
| 2005/0116615 A1 | 6/2005 | Matsumoto et al. |

* cited by examiner

OLED WITH MAGENTA AND GREEN EMISSIVE LAYERS

CROSS REFERENCE TO RELATED APPLICATIONS

This application claims priority from, and is a continuation-in-part of, commonly assigned U.S. patent application Ser. No. 11/113,484 filed Apr. 25, 2005 now U.S. Pat. No. 7,471,041 by Jeffrey P. Spindler, entitled "OLED Multicolor Displays"; and U.S. patent application Ser. No. 11/113,915 filed Apr. 25, 2005 by Jeffrey P. Spindler entitled "Multicolor OLED Displays".

Reference is made to commonly assigned U.S. patent application Ser. No. 11/050,162 filed Feb. 3, 2005 by Dustin L. Winters, et al., entitled "Making Multicolor OLED Displays"; and U.S. patent application Ser. No. 11/048,385 filed Feb. 1, 2005 by Michael E. Miller, et al., entitled "Color Display Device with Enhanced Pixel Pattern" the disclosures of which are incorporated by reference herein.

FIELD OF INVENTION

The present invention relates to organic light emitting diode (OLED) displays. More specifically, this invention relates to multicolor OLED displays having three or more pixels with improved power efficiency.

BACKGROUND OF THE INVENTION

Color, digital image display devices based on organic light emitting diodes (OLED) are well known. In the simplest form, an OLED is comprised of an anode for hole injection, a cathode for electron injection, and an organic media sandwiched between these electrodes to support charge recombination that yields emission of light. In order to construct an OLED display, a plurality of individually addressable OLED elements are arranged in a matrix of pixels. Each pixel includes an independently addressable OLED and is capable of producing light. Such matrixes can be of the passive type where electroluminescent OLED layers are sandwiched between two sets of orthogonal electrodes (rows and columns). An example of a passive matrix driven OLED display device is described in U.S. Pat. No. 5,276,380. Alternately, the OLED display can be constructed of the active matrix type where one or more circuit elements, such as a transistor or capacitor, is used to drive each OLED. An example of an active matrix driven OLED display device is described in U.S. Pat. No. 5,550,066.

In order to construct a multicolor display, the pixels are arranged to produce a variety of colors. For example, a multicolor display can be constructed to have red, green, and blue pixels. Such a display is referred to as an RGB display. Additional colors can be achieved by such a display by mixing the light emitted by the red, green, and blue subpixels in various ratios.

However, the human eye is less sensitive to light emitted by the red pixels or the blue pixels compared to light emitted by the green pixels. One effect of this attribute is that the human eye is less sensitive to spatial detail within the red and blue color channels and therefore it is known to use pixel patterns having fewer red and blue pixels as described in U.S. Pat. No. 5,113,274. The use of fewer red and blue pixels than green pixels is particularly useful when the spatial position of the red and blue subpixels are alternated along both rows and columns within the array of pixels.

Other displays, such as described in U.S. Pat. No. 6,693,611 or in U.S. Patent Application Publication No. 2002/0186214 A1, having additional pixels that emit white color or other colors between that of the green and the red pixels or between that of the blue and green pixels have been proposed. These additional pixels emit light having a color to which the human eye is more sensitive compared to either the red pixels or the blue pixels. As such, one or more of these additional pixels can be combined with one or more of the other pixels to produce mixed colors, such as a white color. The resulting display can produce such mixed colors at a lower power consumption compared to a comparable RGB display.

One approach to constructing such displays having three or more differently colored pixels, as discussed in U.S. Pat. No. 6,693,611, is to provide separate OLED electroluminescent layers for each of the pixels. This results in the need to pattern one or more of the OLED electroluminescent layers such that it is precisely aligned with the desired pixel. Several methods of patterning OLED layers are known in the art. For example, OLED layers can be deposited through a shadow mask in order to selectively deposit only in the desired areas. Shadow masks should then be aligned with the target pixel. Such alignment processes, however, are more complicated and can slow manufacturing throughput. Furthermore, the accuracy of the alignment of the shadow mask to the substrate tends to be poor, thereby requiring large tolerances for the patterned layers resulting in wasted surface area of the display. Shadow masks also tend to cause damage to the OLED pixels when the mask contacts the display substrate. Alternate methods of separately patterning OLED layers for each layer are also known. For example, a method of patterning the OLED layers by transferring the OLED material from a donor sheet by use of a laser is known. However, this method requires the use of consumable donor substrates and complex laser writing equipment. The process of writing each pixel with a laser can also reduce manufacturing throughput. Another example process for patterning OLED layers involves deposition of the OLED materials dissolved in a solvent as droplets by way of an ink jet print head. This method requires the precision placement of the ink jet droplets. As such, complex structures for controlling droplet placement and spread can be required and tolerances for the pixel area can be large.

Yet another approach for constructing displays, as is known in the art, is to use a broadband white emitting OLED combined with R, G, and B color filters. This method reduces the need for precisely aligning or patterning the OLED layers, and the color filters can be pre-patterned using conventional photolithography techniques. However, this method results in a display with higher power consumption because the color filters absorb a significant amount of the light.

SUMMARY OF THE INVENTION

It is an object of the present invention to avoid the above-mentioned problems and provide a multicolor OLED display with improved power efficiency that reduces the need for precisely patterning one or more of the OLED layers.

This object is achieved by an OLED display having at least red, green, and blue colored pixels, comprising:

a) a magenta light emitting layer provided over a substrate for red and blue pixels and a green light emitting layer provided over the substrate for producing at least a green pixel; and b) first and second color filters in operative relationship with the magenta light-emitting layer to respectively produce red and blue pixels.

Advantages

The present invention provides a multicolor OLED display having at least three different color pixels that can be made more effectively.

Because of the organization of the design of the multicolor OLED display, simplified manufacturing steps can be used with fewer precise alignments.

A feature of the present invention is that multicolor OLED displays made in accordance with the present invention can provide displays with a large color gamut at improved power efficiency.

DETAILED DESCRIPTION OF THE INVENTION

Figure 1:
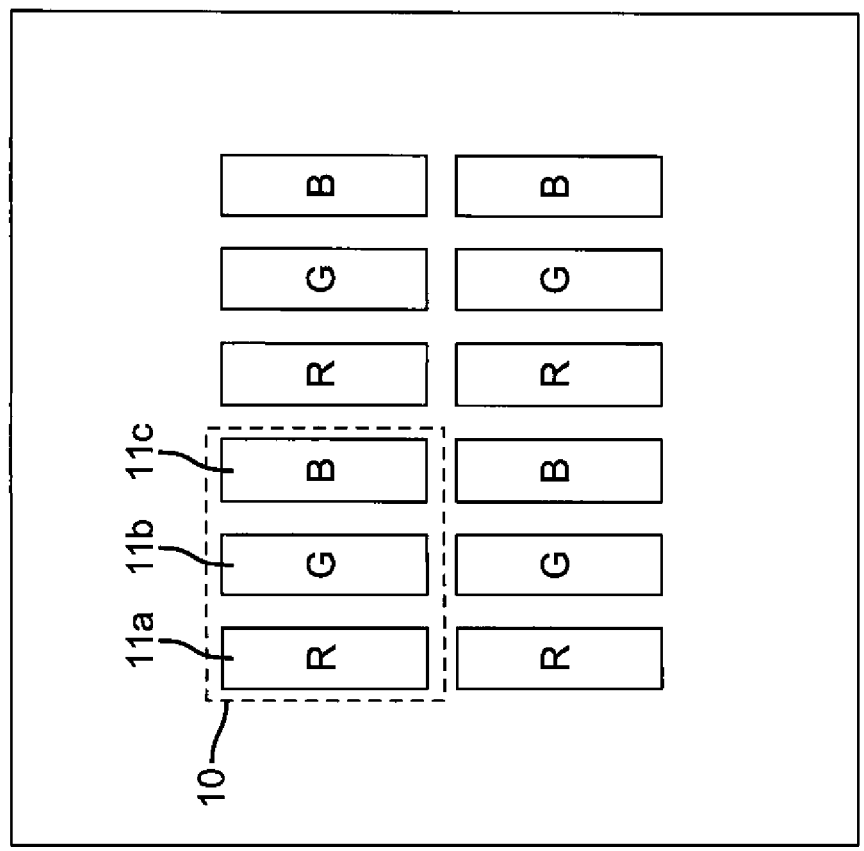
FIG. 1 shows a multicolor OLED display having three differently colored pixels as known in the prior art.

FIG. 1 shows an example of a multicolor OLED display including three pixels that produce different colored light emission. For example, pixel 11a preferably produces red light, pixel 11b preferably produces green light, and pixel 11c preferably produces blue light. These pixels can be arranged in groups, such as pixel group 10. Although it is shown that each pixel group includes each of the differently colored pixels, the present invention is not limited to this case. Instead, some colored pixels can be present in greater number than other colored pixels.

Throughout this specification, the short wavelength or blue portion of the visible spectrum generally will refer to a range of wavelengths within the visible spectrum with wavelengths shorter than 500 nm. The middle wavelength or green portion of the visible spectrum will generally refer to a range of wavelengths between 500 and 600 nm. The long or red portion of the visible spectrum will include wavelengths that are within the visible spectrum but that generally have wavelengths longer than 600 nm.

Figure 2:
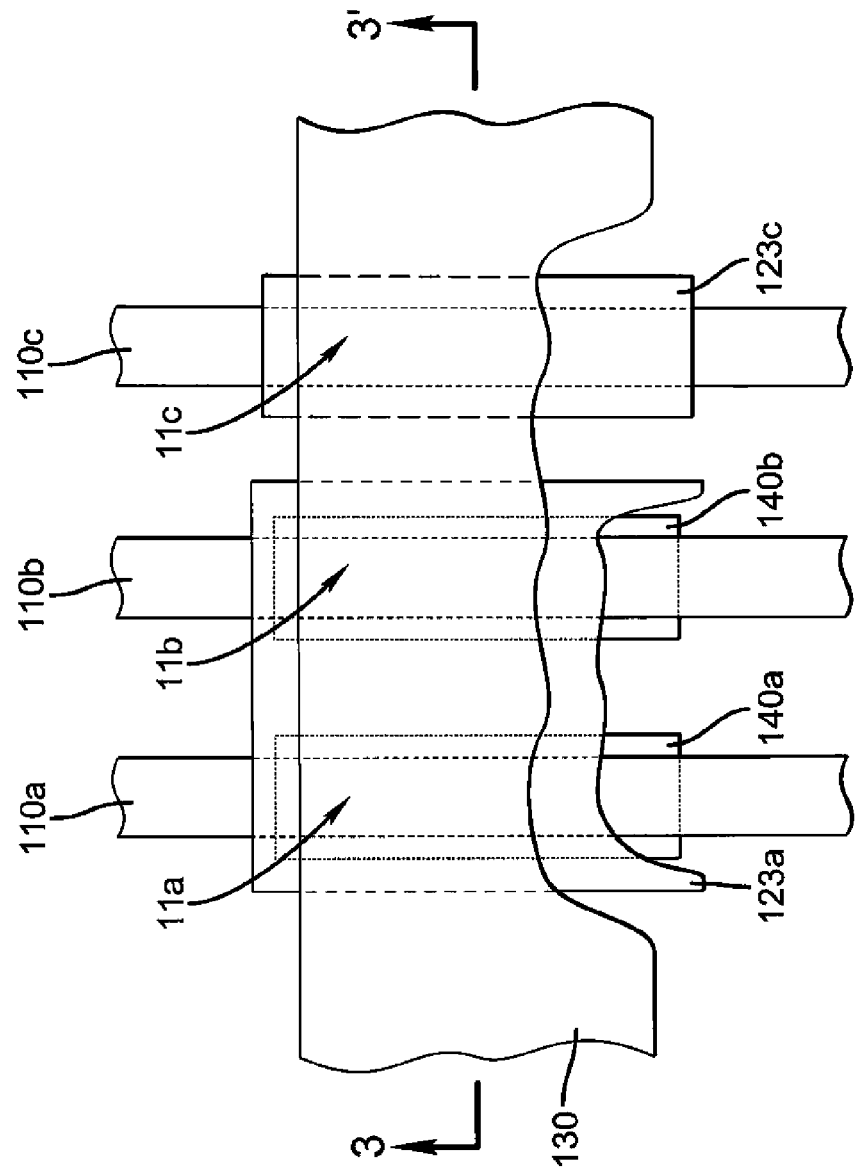
FIG. 2 shows a topside view of a group of pixels according to the first embodiment of the present invention.

FIG. 2 shows a top side view of pixels 11a, 11b, and 11c according to the first embodiment of the present invention. In a passive matrix configuration, these pixels can be addressed by providing a matrix of orthogonal electrodes such as first electrodes 110a, 110b, and 110c and second electrode 130. That is, pixel 11a is constructed from first electrode 110a and second electrode 130, pixel 11b is constructed from first electrode 110b and second electrode 130, and pixel 11c is constructed from first electrode 110c and second electrode 130. In this configuration, all pixels in a column share the same first electrode and all pixels in a row share the same second electrode. As such, these pixels are arranged into a stripe pattern. However, the present invention is not limited to this arrangement and other arrangements such as delta pattern arrangements and quad arrangements can be applied by one skilled in the art. Furthermore, the present invention is not limited to the passive matrix configuration and an active matrix driving scheme can be applied by one skilled in the art.

According to one embodiment of the present invention, magenta light emitting layer 123a is provided for pixels 11a and 11b to be common between both of these pixels. This requires light emitting layer 123a to be precisely aligned or patterned to these pixels. Green light emitting layer 123c is provided for pixel 11c and also requires a precise alignment or patterning step. In this manner, the number of precision aligned depositions required to form these three differently colored pixels is reduced from three to two. Magenta light emitting layer 123a can be formed from a single step, such as for example, deposition through a single shadow mask, precise placement of one or more droplets from the same ink jet head, or transfer from the same donor sheet. As such, this layer can be continuously formed between pixels 11a and 11b as shown. This can be achieved, for example, by using a single opening in the shadow mask to deposit the entire layer. Similarly, green light emitting layer 123c can be formed from a single source. Such a continuous arrangement is preferred to reduce surface area allocated for alignment tolerances in the manufacturing process. To facilitate such a continuous arrangement, the pixels, which share the same light emitting layer, are preferably disposed to be adjacent to one and other. For example, pixel 11a is adjacent to pixel 11b as shown.

Light emitting layer 123a is arranged to emit light having a spectrum including energy within both the short and long portions of the visible spectrum, otherwise referred to as magenta. Light emitting layer 123a is arranged so as to produce light having spectral components corresponding to the desired colors of both pixel 11a and pixel 11b. This can be achieved by forming a light emitting layer of materials that emits energy in both the long and short wavelength portions of the visible spectrum with little energy emission within the middle wavelength portion of the visible spectrum. Similarly, light emitting layer 123c is preferably arranged to emit light having a spectrum corresponding to a green color but may also emit light having content in the blue-green or green-red portions of the spectrum. Light emitting layer 123c is arranged so as to produce light having spectral components corresponding to the desired color of pixel 11c.

To achieve the red color desired for pixel 11a, color filter 140a is formed in the path of the light emission, or in operative relationship, in pixel 11a to absorb the short wavelength spectral components for pixel 11a and pass the desired long wavelength spectral components corresponding to the desired red color. Color filter 140a can be constructed, for example, to transmit red light and absorb light having lower wavelengths. Alternatively, color filter 140a can be constructed to transmit red and green light and absorb only the short wavelength blue light. To achieve the blue color desired for pixel 11b, color filter 140b is formed in operative relationship, that is, at least partially in the path of the light emission between the pixel and the viewer, in pixel 11b to absorb undesired spectral components for pixel 11b and pass the desired spectral components corresponding to the desired a blue color. That is, color filter 140b can be constructed, for example, to transmit blue light and absorb light having different wavelengths. Alternatively, color filter 140b can be constructed, for example, to transmit blue and green light and absorb only red light. The green color desired for pixel 11c can be achieved with or without the use of a color filter, although color filters may be employed to improve the purity of the green light emission. This may be particularly desirable if the green light emitting layer 123c actually emits blue-green or green-red light.

Figure 3:
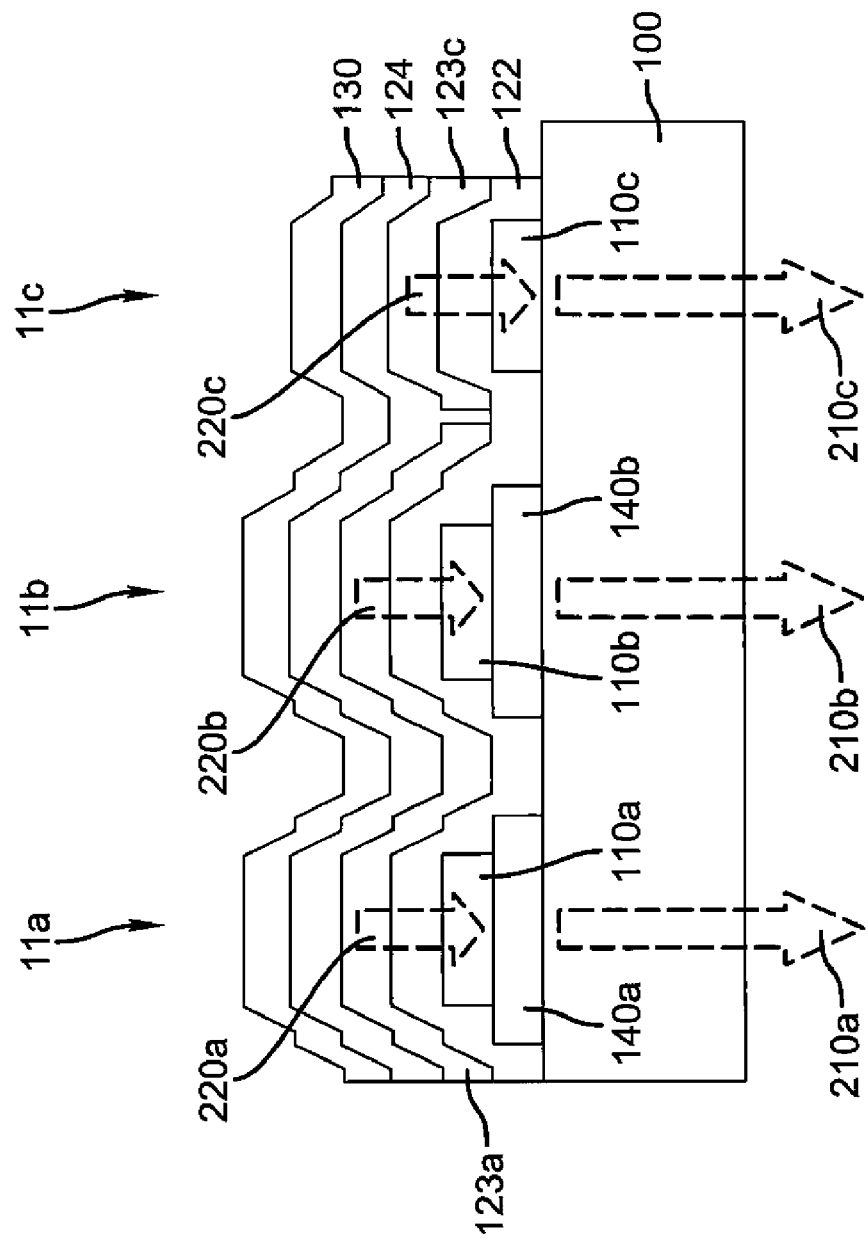
FIG. 3 shows a cross section view of a group of pixels taken along the line 3-3' of FIG. 2.

FIG. 3 shows a cross sectional view of the device of FIG. 2 taken along line 3-3'. FIG. 3 shows that pixels 11a, 11b, and 11c produce internal light emission 220a, 220b, and 220c, respectively. Internal light emission 220c exits the device without filtration to become external light emission 210c. Internal light emission 220a passes through color filter 140a prior to exiting the device resulting in external light emission 210a. Similarly, internal light emission 220b passes through color filter 140b prior to exiting the device resulting in external light emission 210b. Color filters 140a and 140b are preferably organic layers deposited by lamination or spin coating methods known in the art. The color filters are preferably photopatternable as is known in the art wherein the color filter materials are deposited over the entire display surface, exposed with a light source, and either the exposed or the unexposed regions are removed by use of a solvent. This method provides effective alignment accuracy to the desired pixel region. However, the present invention is not limited to this preferred case, and other ways of depositing and patterning the color filter material as are known in the art can be employed by one skilled in the art. Furthermore, additional black matrix structures (not shown) which absorb some portion of all visible light can optionally be disposed in the non-emitting regions between pixels to reduce ambient light reflection and improve display contrast as is known in the art.

The pixels are constructed over substrate 100. Light can exit the device by passing through substrate 100 as shown. Such a configuration is known as a bottom emitting device. Substrate 100 should be constructed of a transparent material such as glass or plastic. Alternately, the device can be constructed so that light exits the device in the direction opposite the substrate. Such a configuration is known as a top emitting device. The substrate can be selected from materials that are not transparent such as metals, or semiconductor materials like silicon wafers.

For the case of the bottom emitting device, as shown, first electrodes 110a, 110b, and 110c are arranged to transmit light and are preferably constructed of a conductive transparent material such as indium tin oxide (ITO) or indium zinc oxide (IZO). Second electrode 130 is preferably constructed of a reflective conductive material such as aluminum, silver, magnesium silver alloy, or the like. These electrodes can be constructed of a single layer or of multiple layers to achieve the desired light absorption or reflection properties and conductivity properties. For the alternate case of a top emitting device, it is preferable that the second electrode is transparent and the first electrode is reflective. A top emitting device, color filters 140a and 140b would be disposed in the path of the light on the side of the second electrode. Although the first electrodes are shown as being arranged in the column direction and the second electrode is shown as being arranged in the row direction, the opposite arrangement is also possible.

Figure 4:
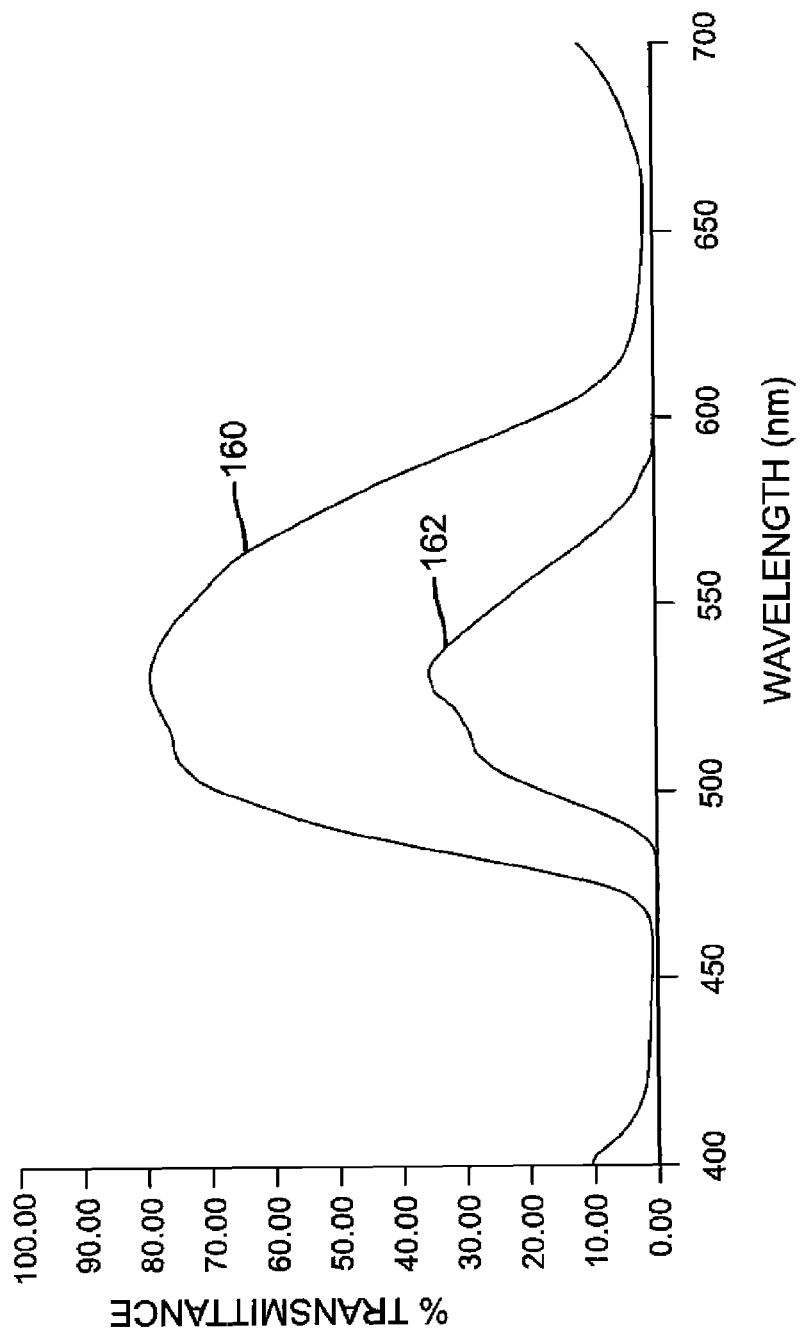
FIG. 4 shows a plot of the spectral transmittance of two narrowband color filters as a function of wavelength as known in the prior art.

To fully realize the benefits of this invention, it is important to recognize that the organic materials from which color filters are typically formed are highpass or bandpass in nature. Further, the passband characteristics of these filters are often manipulated by manipulating the thickness of the filter. Specifically, color filters with a narrow pass bands are typically thicker than color filters having a broad pass band. The increases in thickness of the color filters that decrease the width of the pass band of the color filter also result in a decrease in the peak transmission of the color filter. This is exemplified in FIG. 4, which shows the transmission spectra for a single color filter material that is applied to three different thicknesses. FIG. 4, shows a spectral transmittance curve 160 of a traditional LCD color filter having with a pass band that has a full width at half the maximum transmission of 100 nm. Note that the peak transmittance of this color filter occurs near 535 nm and is 80 percent. By increasing the thickness of the color filter, a color filter having the spectral transmittance curve 162 may be obtained. has a pass band of 58 nm. The peak transmittance of this color filter also occurs near 535 nm and is 36 percent. The advantage of using the color filter having spectral transmittance curve 162 over the color filter having the spectral transmittance curve 160 in conjunction with a broadband source is that the color purity of the final emission is greatly improved. In fact, using these two color filters in conjunction with a light emitting layer having a broadband white emission, allows the CIE chromaticity coordinates to be moved from x=0.2954, y=0.5885 for the color filter having transmittance curve 160 to x=0.2129 y=0.7116 for the color filter having transmittance curve 162. Therefore applying the color filter having the transmittance curve 162, which has a narrower pass band, instead of the color filter having the transmittance curve 160, results in a much purer emission for a pixel and when such a pixel is applied with other colored pixels the resulting display will have a much larger color gamut. However, the peak transmittance of the color filter is reduced as bandwidth is narrowed and therefore the efficiency of the resulting pixel is significantly reduced. Notice that even for a monochromatic light emitting element that produces emission at the peak of the color filter transmission curve, only 36 percent of the light will be transmitted by the color filter having transmittance curve 162 as opposed to 80 percent for the color filter having transmittance curve 160. Therefore, even in this ideal case, the efficiency of the resulting pixel after filtering is reduced by a ratio of 36 to 80 or to less than half its original value. In a full color display employing such filters, similar losses can occur in each colored pixel and such displays having a large color gamut may be ⅙ th as efficient or less than a display having a smaller color gamut.

Figure 5:
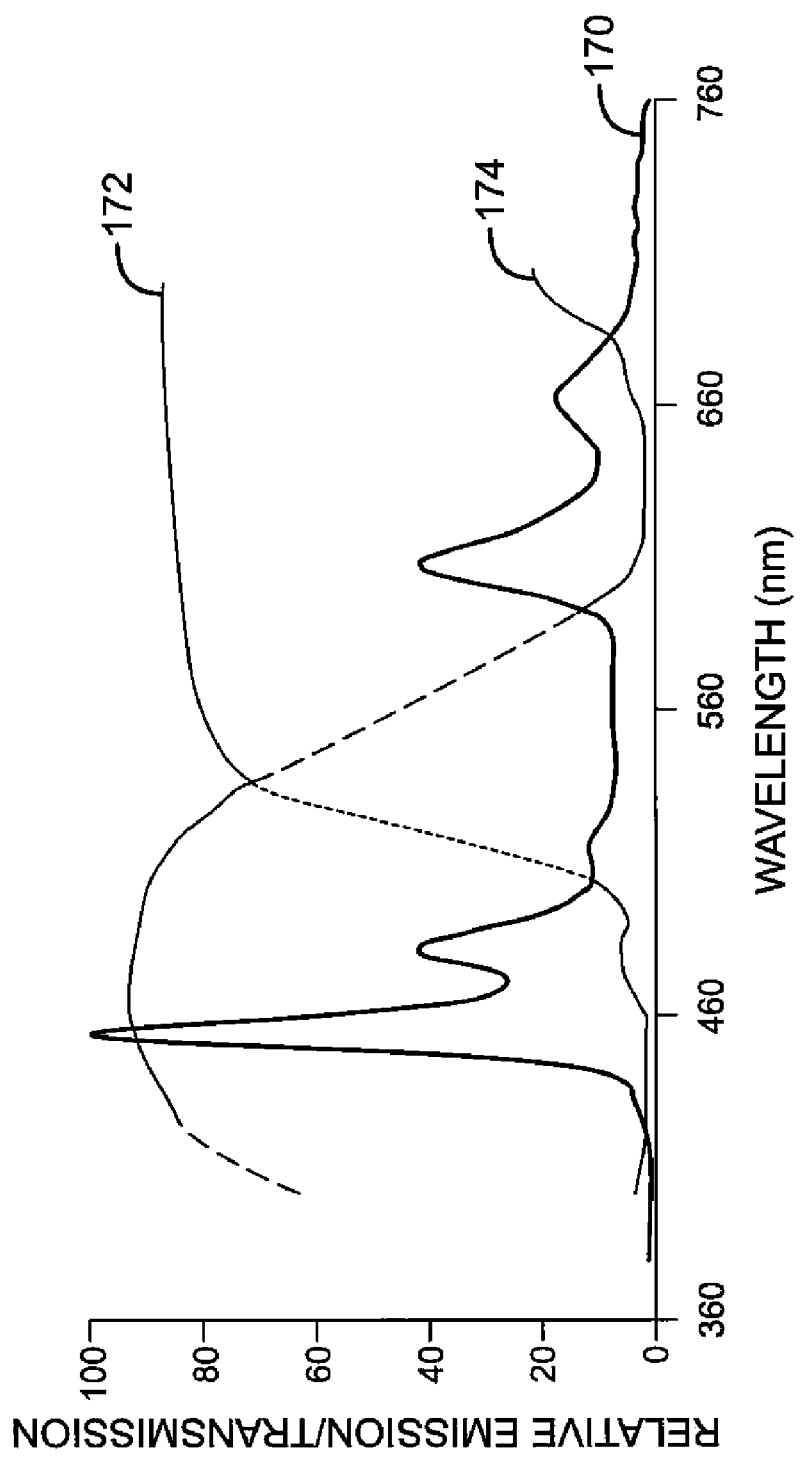
FIG. 5 shows a plot of a the relative emission of a magenta light emitting layer, as well as, the spectral transmittance of two broadband color filters as a function of wavelength.

Since color filters in a device of the present invention are used primarily to block unwanted emission within only the high or low portions of the visible spectrum, very broad band color filters may be employed in the device of the present invention. The use of these broadband color filters allows displays to be formed having a high efficiency. FIG. 5 shows the relative spectral emission curve of a magenta light emitting layer 170 as is useful in the present invention. Also shown are a spectral transmittance curve for a broadband yellow color filter 172, useful in passing long wavelength red light while absorbing short wavelength blue light and a spectral transmittance curve for a broad band cyan color filter 174, useful in passing short wavelength blue light while absorbing long wavelength red light. Each of these color filters fulfill the desired function, the yellow color filter absorbs the blue emission from the blue peak in the magenta light emitting layer 123a and the cyan color filter absorbs the red emission for the red peaks of the magenta light emitting layer 123a but allow a very high transmittance of the desired light emission. As such, a display using this emission and filtering mechanism can allow a very high percentage (around 40 to 50 percent) of the light that is emitted to be transmitted through each color filter. Therefore, a display of the present invention can have a much higher efficiency than a display employing narrow bandwidth color filters to filter a broadband width emission. Further, bandwidth of the emission peaks may be narrowed or their peak emission spectra may be moved towards the extremes of the visual spectrum to improve the color gamut of the display without any loss of efficiency through the color filters.

Figure 6:
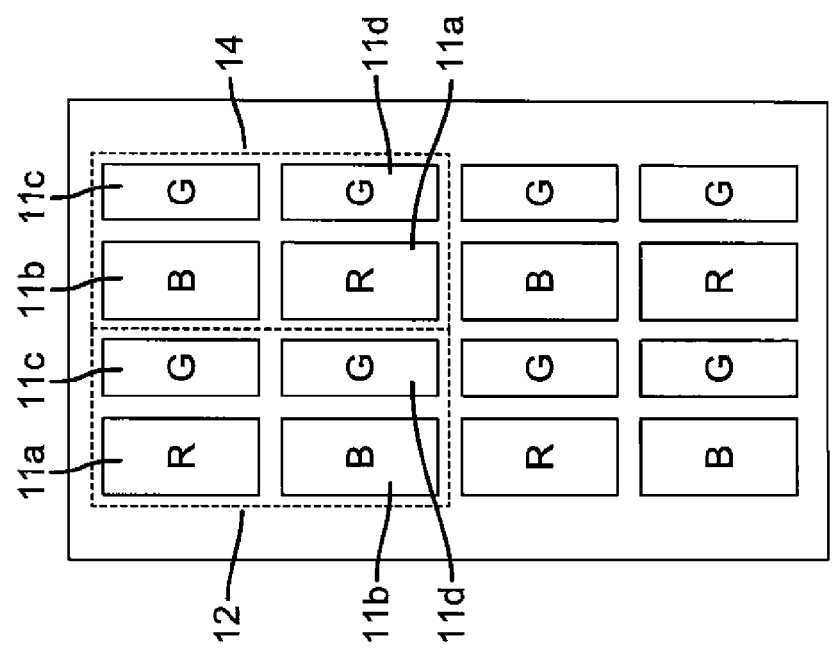
FIG. 6 shows a multicolor OLED display having two different pixel groups, each having three differently colored pixels as known in the prior art.

Although this invention may be used to form a multicolor OLED display having pixel groups such as the one shown in FIG. 1, this invention may alternatively be used to form a multicolor OLED display having alternative pixel groups. FIG. 6 shows an example of a multicolor OLED display including pixels that produce three different colors of light emission which are arranged in an alternative pixel pattern to form an alternative pixel group. Further, it is not necessary that each pixel group contain exactly the same arrangement of pixels. In fact, using the method of the present invention, different pixel groups can be formed by manipulating the patterning of color filters as opposed to new deposition methods. As shown in FIG. 6, a first alternate pixel group 12 may be formed having the first pixel 11a emitting red light, the second pixel 11b emitting blue light, the third pixel 11c emitting green light and a fourth pixel 11d emitting green light. Further as shown in FIG. 6, the pixels may be formed to have different emitting areas. For example, as shown in FIG. 6, the first pixel 11a emitting red light and the second pixel 11b emitting blue light may be larger in area than the third pixel 11c and forth pixel 11d which emit green light. Further, these same four colored pixels may be arranged within alternate pixel groups, such as pixel group 14 in which the position of the first pixel 11a emitting red light and the second pixel 11b emitting blue light are interchanged with respect to the pixel group. As will be shown, since each of the first and second pixels (11a and 11b) may be formed from the same light emitting layer, only the color filter arrangement must be modified provide this feature. The use of more than one pixel arrangement of this type is known to provide an increase in image quality for a fixed number of pixels at certain resolutions as discussed in U.S. patent application Ser. No. 11/048, 385, the disclosure of which is herein incorporated by reference. An important feature of such having such a pixel pattern is that the are relatively fewer pixels that emit red and blue light than pixels emitting green light and that the relative positions of the red and blue light emitting pixels is interchanged within neighboring rows or columns of pixels.

Figure 7:
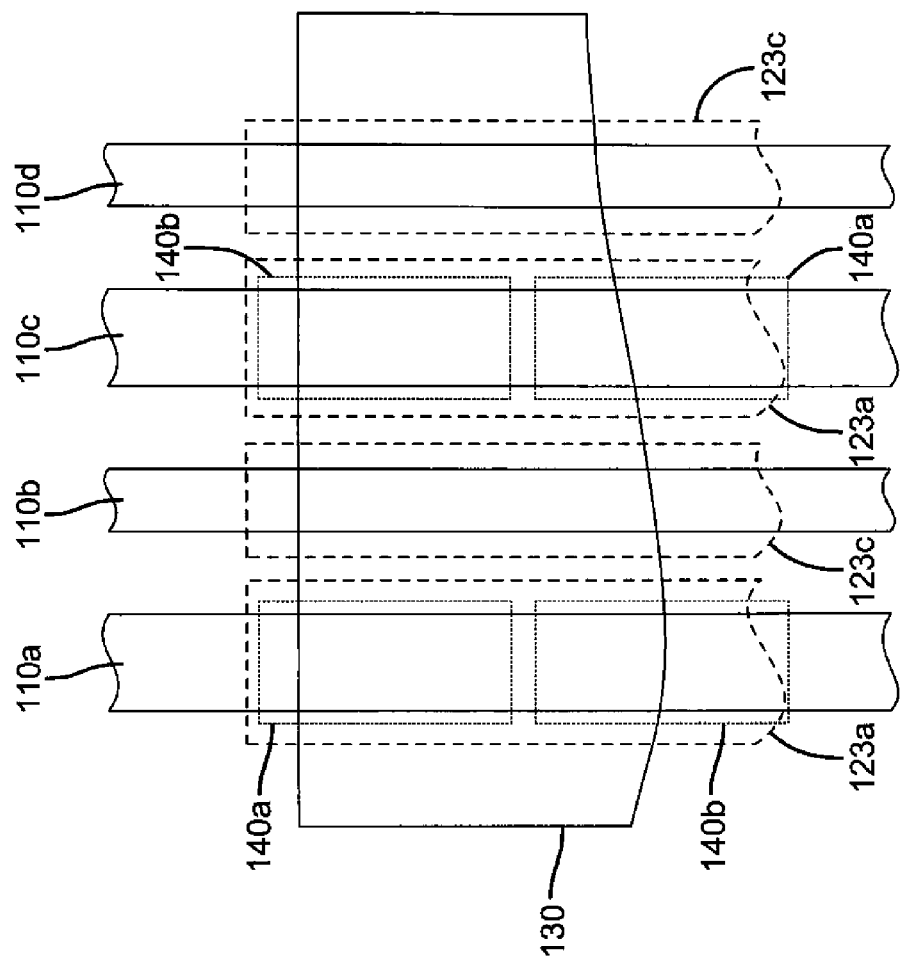
FIG. 7 shows a top side view of two different pixel groups useful in forming the display of FIG. 6.

FIG. 7 shows a topside view of the two rows of pixels within pixel groups 12 and 14 according to an embodiment of the present invention as depicted in FIG. 6. In a passive matrix configuration, these pixels can be addressed by providing a matrix of orthogonal electrodes such as first electrodes 110a, 110b, 110c and 110d and second electrode 130. That is, pixel 11a is constructed from first electrode 110a and second electrode 130, pixel 11b is constructed from first electrode 110b and second electrode 130, pixel 11c is constructed from first electrode 110c and second electrode 130 and pixel 11d is constructed from first electrode 110d and second electrode 130. In this configuration, all pixels in a column share the same first electrode and all pixels in each row and column share the same second electrode. As such, these pixels are arranged into a stripe pattern. However, the present invention is not limited to this arrangement and other arrangements such as delta pattern arrangements and quad arrangements can be applied by one skilled in the art. Furthermore, the present invention is not limited to the passive matrix configuration and an active matrix driving scheme can be applied by one skilled in the art.

According to one embodiment of the present invention, light emitting layer 123a is provided for pixels 11a and 11b to be common between both of these pixels. This requires light emitting layer 123a to be precisely aligned or patterned to these pixels. Light emitting layer 123c is provided for pixel 11c and 11d and requires a precise alignment or patterning step. In this manner, the number of precision aligned depositions required to form these three differently colored pixels is reduced from three to two. Light emitting layer 123a can be formed from a single step, such as for example, deposition through a single shadow mask, precise placement of one or more droplets from the same ink jet head, or transfer from the same donor sheet. As such, this layer can be continuously formed between pixels 11a and 11b as shown. This can be achieved, for example, by using a single opening in the shadow mask to deposit the entire layer. Similarly, light emitting layer 123c can be formed from a single source. Such a continuous arrangement is preferred to reduce surface area allocated for alignment tolerances in the manufacturing process. To facilitate such a continuous arrangement, the pixels, which share the same light emitting layer, are preferably disposed to be adjacent to one and other. For example, pixel 11a is vertically adjacent to pixel 11b as shown.

To achieve the red color desired for pixel 11a, color filter 140a is formed in the path of the light emission, or in operative relationship, in pixel 11a to absorb the short wavelength spectral components for pixel 11a and pass the desired long wavelength spectral components corresponding to the desired red color. Color filter 140a can be constructed, for example, to transmit red light and absorb light having lower wavelengths. Alternatively, color filter 140a can be constructed to transmit red and green light and absorb only the short wavelength blue light. To achieve the blue color desired for pixel 11b, color filter 140b is formed in operative relationship, that is, at least partially in the path of the light emission between the pixel and the viewer, in pixel 11b to absorb undesired spectral components for pixel 11b and pass the desired spectral components corresponding to the desired a blue color. That is, color filter 140b can be constructed, for example, to transmit blue light and absorb light having different wavelengths. Alternatively, color filter 140b can be constructed, for example, to transmit blue and green light and absorb only red light. The green color desired for pixel 11c can be achieved with or without the use of a color filter, although color filters may be employed to improve the purity of the green light emission. This may be particularly desirable if the green light emitting layer 123c actually emits blue-green or green-red light.

Figure 8:
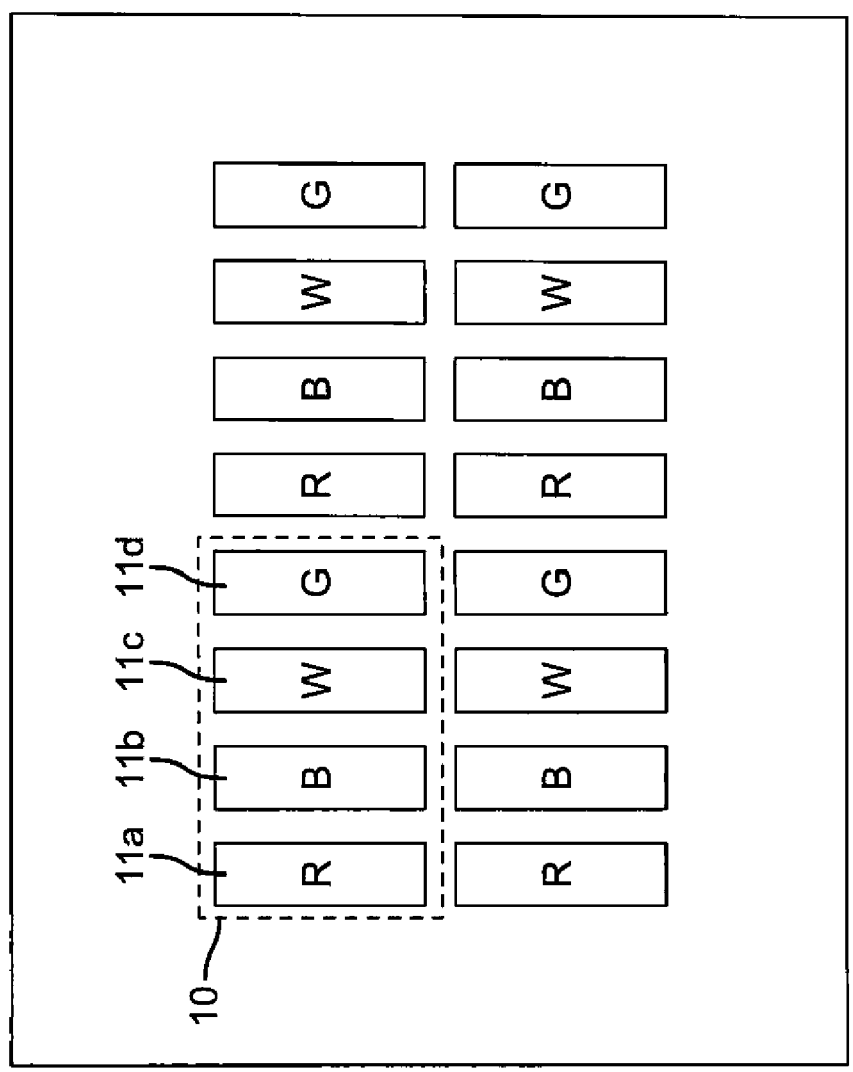
FIG. 8 shows a multicolor OLED display having four differently colored pixels.

The above embodiments are described as providing three differently colored pixels. However, some advantage can be obtained according to alternate embodiments whereby four differently colored pixels are provided. In FIG. 8 for example, a multicolor display can be constructed according to the present invention by providing a first pixel 11a emitting red light, a second pixel 11b emitting blue light, a third pixel 11c emitting green light, and a fourth pixel 11d emitting a color different than that of the first, second, and third. pixels. While FIG. 8 shows a pixel group that may be formed, other pixel groups may also be used and it is possible to apply multiple pixel groups within a display. Other desirable arrangements of four pixels having multiple pixel groups are discussed in U.S. Ser. No. 10/206,456, the disclosure of which is herein incorporated by reference.

Figure 9:
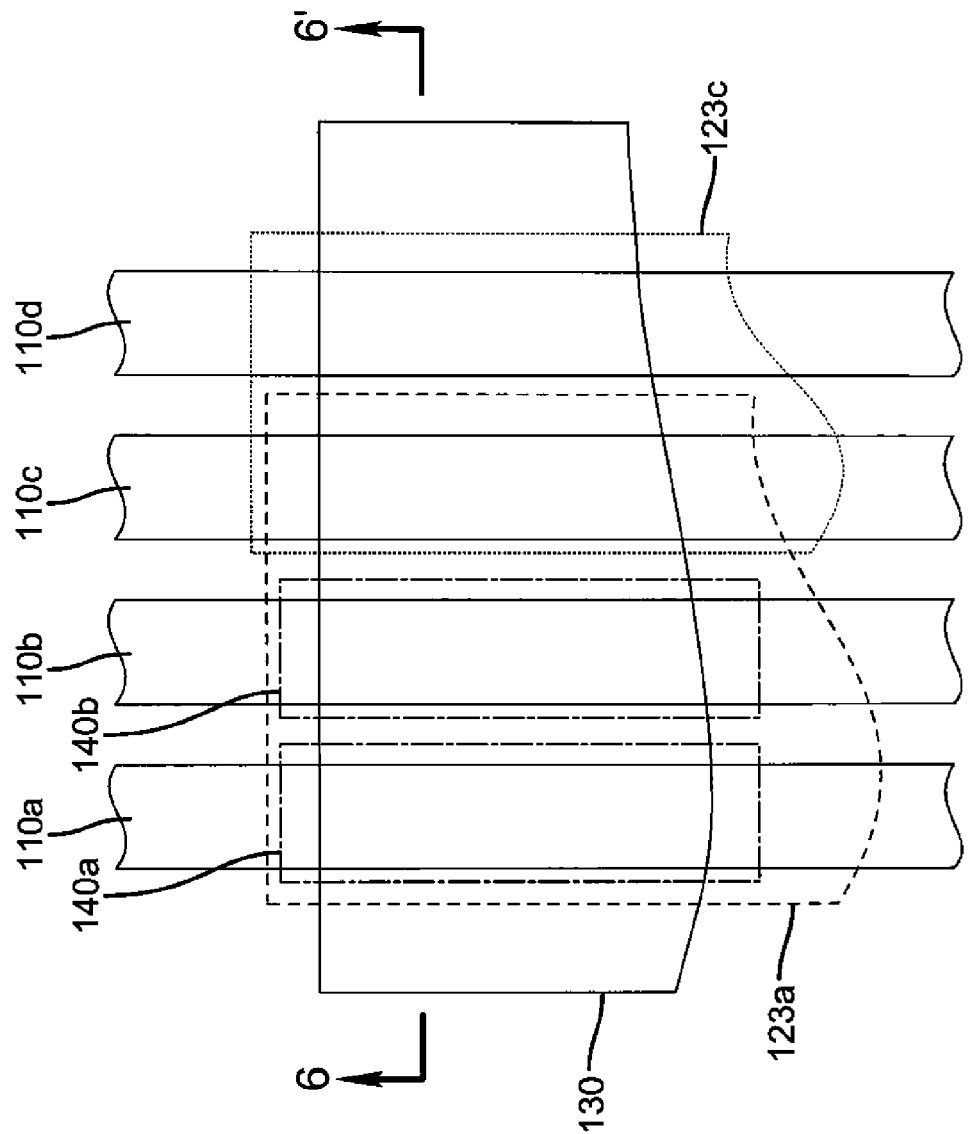
FIG. 9 shows a top side view of a group of pixels useful in forming the display of FIG. 8.

FIG. 9 shows a top side view of pixels 11a, 11b, 11c, and 11d according to the second embodiment of the present invention. The magenta light emitting layer 123a is provided for pixels 11a, 11b, and 11c to be common between these pixels, and therefore requires a precise alignment or patterning step. The green light emitting layer 123c is provided for pixels 11c and 11d, and requires a precise alignment or patterning step. In this manner, the number of precision aligned depositions required to form these four differently colored pixels is reduced from four to two. Light emitting layers 123a and 123c can be formed as previously described.

The combination of light emitting layers 123a and 123c in pixel 11d is arranged so as to produce light having broadband spectral components corresponding to the desired color of pixel 11d. The broadband emission is defined as a spectrum having emission throughout the visible wavelength range, and can be white in color. In order to achieve the red color desired for pixel 11a, color filter 140a is formed in the path of the light emission in pixel 11a to absorb undesired spectral components and pass the desired spectral components corresponding to the desired red color. To achieve the blue color desired for pixel 11b, color filter 140b is formed in the path of the light emission in pixel 11b to absorb undesired spectral components and pass the desired spectral components corresponding to the desired blue color. The broadband white color desired for pixel 11d is achieved without the use of a color filter. The green color desired for pixel 11c can be achieved with or without the use of a color filter. A multicolor OLED display made in this manner can have higher power efficiency. The high efficiency unfiltered broadband emission spectrum used in pixel 11d can be used more frequently, and the typically lower luminance efficiency red, and blue pixels less frequently, to produce colors containing much neutral content, as is known in the art. Efficiency can be measured for example in candelas (cd) per ampere (A) of current. As such high efficiency light emission results in displays that consume less power, or in other words, have high power efficiency.

Figure 10:
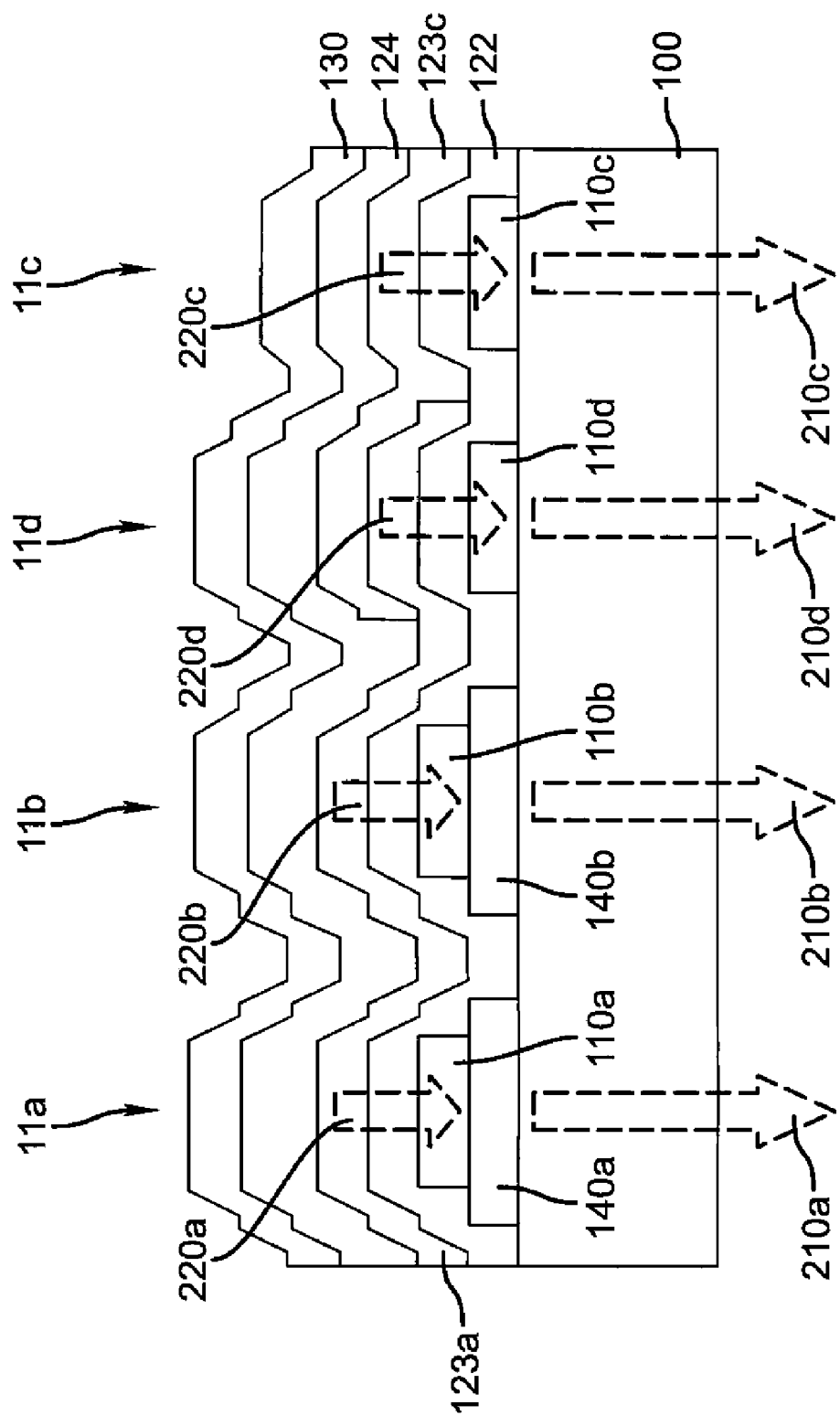
FIG. 10 shows a cross section view of a group of pixels taken along the line 6-6' of FIG. 9.

FIG. 10 shows a cross sectional view of the device of FIG. 9 taken along line 6-6'. FIG. 6 shows that pixels 11a, 11b, 11c, and 11d produce internal light emission 220a, 220b, 220c, and 220d, respectively. Internal light emission 220c and 220d exit the device without filtration to become external light emission 210c and 210d, respectively. Internal light emission 220a passes through color filter 140a prior to exiting the device resulting in external light emission 210a. Similarly, internal light emission 220b passes through color filter 140b prior to exiting the device resulting in external light emission 210b. Color filters 140a and 140b are preferably organic layers as described previously.

The pixels are constructed over substrate 100. Light can exit the device by passing through substrate 100 for the case of the bottom emitting device, as shown. First electrodes 110a, 110b, 110c, and 110d are arranged to transmit light and are preferably constructed of a conductive transparent material such as previously described. Second electrode 130 is preferably constructed of a reflective conductive material such as previously described in order to achieve the desired light absorption or reflection properties and conductivity properties.

According to the present invention, light emitting layer 123a is provided for pixels 11a, 11b and 11d to be common between these pixels. This requires light emitting layer 123a to be precisely aligned or patterned to these pixels. Similarly, light emitting layer 123c is provided for pixels 11c and 11d, and also requires a precise alignment or patterning step. In this manner, the number of precision aligned depositions required to form these four differently colored pixels is reduced from four to two. Further, the use of precision alignment typically requires a gap on the order of 20 micrometers between pixels to insure that unintended deposition of one light emitting material on an unintended pixel while other manufacturing steps often have tolerances on the order of 1 or 2 micrometers. It is, therefore, possible to decrease the space between pixels 11a and 11b, resulting in a higher resolution display device when using a deposition method of the present invention. Light emitting layers 123a and 123c can be formed as previously described. Light emitting layer 123a can be continuously formed between pixels 11a and 11b as shown. This can be achieved, for example, by using a single opening in the shadow mask to deposit the entire layer. Such a continuous arrangement is preferred to reduce the surface area allocated for alignment tolerances in the manufacturing process. To facilitate such a continuous arrangement, the pixels, which share the same light emitting layer, are preferably disposed to be adjacent to one and other. For example, pixels 11a and 11b are disposed adjacent to each other as shown. The present invention, however, is not limited to this preferred embodiment and alternate embodiments where the light emitting layer is discontinuous between the two pixels or the two pixels are spaced apart are possible. Such alternate embodiments are still advantageous in that the number of precision aligned depositions is reduced.

While the prior embodiments required that the magenta light emitting layer 123a to be deposited only on the red and blue pixels (11a and 11b), while the green light emitting layer was deposited only on the green pixel 11c, it may also be beneficial to overlap these light emitting layers for some of the pixels. For example, a display, as shown in FIG. 1, may alternatively be constructed by providing the magenta light emitting layer 123a for pixels 11a, 11b and 11c while the green light emitting layer 123c may be provided only for pixel 11c. This embodiment has the additional benefit that it is not necessary to provide a precision alignment when depositing the magenta light emitting layer 123a but only requires a precision alignment when depositing the green light emitting layer 123c. However, this embodiment does require that a green color filter be used to filter the white light formed by overlapping light emitting layers 123a and 123c to achieve a green pixel 11c. Therefore, within this embodiment the magenta and green light emitting layers (123a and 123c) overlap in a region to produce white light, and a green color receives the light corresponding to a white pixel to produce the green pixel.

Figure 11:
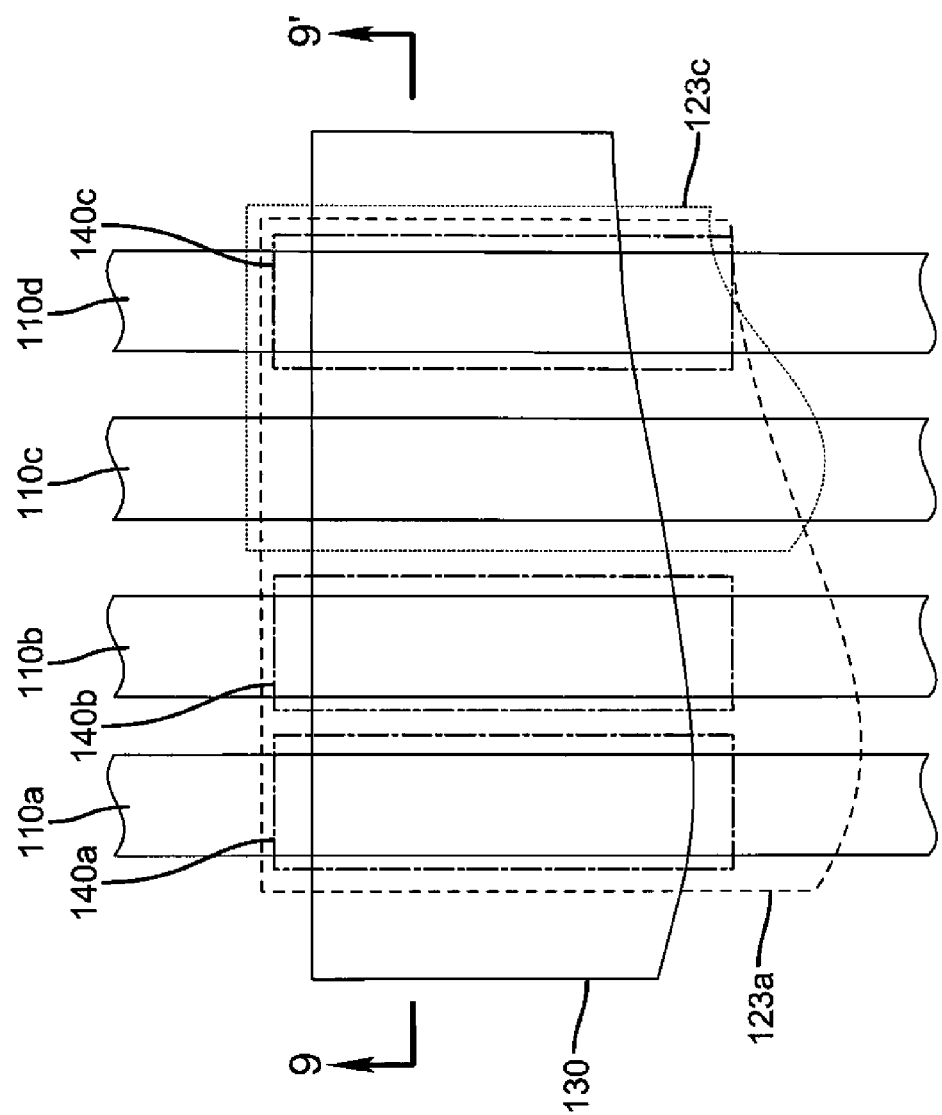
FIG. 11 shows a top side view of a another group of pixels useful in forming the display of FIG. 8.

A particular embodiment that requires partial overlap of the light emitting layers (123a and 123c) to form either at least one of the first or second pixels (11a or 11b) or the third pixel 11c is shown in FIG. 8. As shown in FIG. 8, a multicolor display can be constructed according to the present invention by providing a first pixel 11a emitting red light, a second pixel 11b emitting blue light, a third pixel 11c emitting green light, and a fourth pixel 11d emitting a color different than that of the first, second, and third pixels. FIG. 11 shows a top side view of pixels 11a, 11b, 11c, and 11d according to this embodiment of the present invention. The magenta light emitting layer 123a is provided for pixels 11a, 11b, 11c and 11d and is, therefore, common to all pixels within the display, thereby not requiring a precise alignment or patterning step during deposition. The green light emitting layer 123c is provided for pixels 11c and 11d, and requires one precise alignment or patterning step. In this manner, the number of precision aligned depositions required to form these four differently colored pixels is reduced from four to one. Light emitting layers 123a and 123c can be formed as previously described.

The combination of light emitting layers 123a and 123c in pixels 11c and 11d is arranged so as to produce light having broadband spectral components. The broadband emission is defined as a spectrum having emission within each of the three regions of the visible spectrum, and can be white in color. This broadband emission may be defined to correspond to the desired color of pixel 11d. To achieve the red color desired for pixel 11a, color filter 140a is formed in the path of the light emission in pixel 11a to absorb undesired spectral components and pass the desired spectral components corresponding to the desired red color. To achieve the blue color desired for pixel 11b, color filter 140b is formed in the path of the light emission in pixel 11b to absorb undesired spectral components and pass the desired spectral components corresponding to the desired blue color. The broadband white color desired for pixel 11d can be achieved without the use of a color filter but a color filter may be used to tune the spectral emission of this pixel. To achieve the green color desired for pixel 11c, color filter 140c is formed in the path of the light emission in pixel 11c to absorb undesired spectral components and pass the desired spectral components corresponding to the desired green color. A multicolor OLED display made in this manner can have high power efficiency but require only one precision alignment or patterning step. The high efficiency unfiltered broadband emission spectrum used in pixel 11d can be used more frequently, and the typically lower luminance efficiency red, and blue pixels less frequently, to produce colors containing much neutral content, as is known in the art. Efficiency can be measured for example in candelas (cd) per ampere (A) of current. As such high efficiency light emission results in displays that consume less power, or in other words, have high power efficiency.

Figure 12:
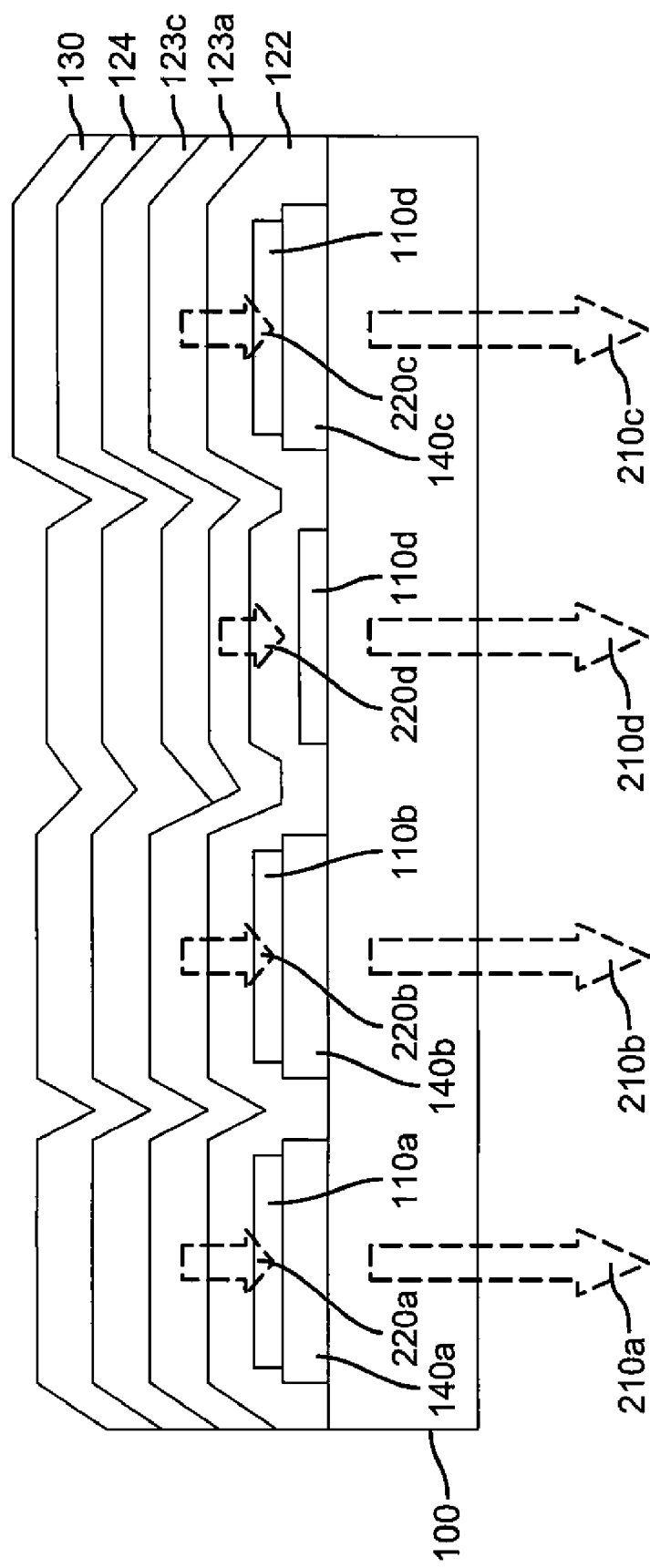
FIG. 12 shows a cross section view of a group of pixels taken along the line 9-9' of FIG. 11.

FIG. 12 shows a cross sectional view of the device of FIG. 11 taken along line 9-9'. FIG. 12 shows that pixels 11a, 11b, 11c, and 11d produce internal light emission 220a, 220b, 220c, and 220d, respectively. Internal light emission 220d exits the device without filtration to become external light emission 210d. Internal light emission 220a passes through color filter 140a prior to exiting the device resulting in external light emission 210a. Similarly, internal light emission 220b passes through color filter 140b prior to exiting the device resulting in external light emission 210b. Finally, internal light emission 220c passes through color filter 140c prior to exiting the device resulting in external light emission 210c. Color filters 140a, 140b and 140c are preferably organic layers as described previously.

The pixels are constructed over substrate 100. Light can exit the device by passing through substrate 100 for the case of the bottom emitting device, as shown. First electrodes 110a, 110b, 110c, and 110d are arranged to transmit light and are preferably constructed of a conductive transparent material such as previously described. Second electrode 130 is preferably constructed of a reflective conductive material such as previously described in order to achieve the desired light absorption or reflection properties and conductivity properties.

According to the present invention, light emitting layer 123a is provided for pixels 11a, 11b, 11c and 11d to be common all pixels. This requires light emitting layer 123a to be precisely aligned or patterned to these pixels. Similarly, light emitting layer 123c is provided for pixels 11c and 11d, and also requires a precise alignment or patterning step. In this manner, the number of precision aligned depositions required to form these four differently colored pixels is reduced from four to one. Further, the use of precise aligning or patterning step may requires a gap on the order of 20 micrometers between pixels to insure that unintended deposition of one light emitting material on an unintended pixel while other manufacturing steps may have tolerances on the order of 1 or 2 micrometers. It is, therefore, possible to decrease the space between pixels 11a and 11b, as well as between 11c and 11d, resulting in a higher resolution display device when using a deposition method of the present invention. Light emitting layers 123a and 123c can be formed as previously described. Light emitting layer 123c can be continuously formed between pixels 11c and 11d as shown. This can be achieved, for example, by using a single opening in the shadow mask to deposit the entire layer. Such a continuous arrangement is preferred to reduce the surface area allocated for alignment tolerances in the manufacturing process. To facilitate such a continuous arrangement, the pixels, which share the same light emitting layer, are preferably disposed to be adjacent to one and other. For example, pixels 11c and 11d are disposed adjacent to each other as shown. The present invention, however, is not limited to this preferred embodiment and alternate embodiments where the light emitting layer is discontinuous between the two pixels or the two pixels are spaced apart are possible. Such alternate embodiments are still advantageous in that the number of precision aligned depositions is reduced.

As was just discussed, the magenta and green light emitting layers (123a and 123c) may be formed to overlap in a region to produce white light and a green color may be used to filter this white light from a pixel to produce the green pixel. It is also possible that the magenta and green light emitting layers (123a and 123c) may overlap in a region to produce white light, and the first and second color filters receive the light corresponding to a white pixel to produce the red and blue pixels. In such an embodiment, the magenta and green light emitting layers will not overlap within the area of the green pixel. As such, this pixel may be formed without a color filter. However, within this embodiment, the red and blue pixels will emit white light and it will be necessary to employ relatively narrowband color filters over the red and blue pixels to allow only red or blue light to pass through the color filters. While this embodiment may be less power efficient than some earlier embodiments, it has the manufacturing advantage that only one precision alignment or patterning step is required to form a display that has three or more differently colored pixels.

The pixels are constructed over substrate 100. Light can exit the device by passing through substrate 100 for the case of the bottom emitting device, as shown. First electrodes 110a, 110b, 110c, and 110d are arranged to transmit light and are preferably constructed of a conductive transparent material such as previously described. Second electrode 130 is preferably constructed of a reflective conductive material such as previously described in order to achieve the desired light absorption or reflection properties and conductivity properties.

Although not always necessary, it is often useful that a hole-injecting layer (not shown) be formed and disposed over first electrodes 110a, 110b, 110c, and 110d. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. No. 6,208,075, and inorganic oxides including vanadium oxide ($VO_x$), molybdenum oxide ($MoO_x$), and nickel oxide ($NiO_x$). Alternative hole-injecting materials reportedly useful in organic EL devices are described in EP 0 891 121 A1 and EP 1 029 909 A1.

Although not always necessary, it is often useful that a hole-transporting layer 122 be formed and disposed over electrodes 110a, 110b, 110c, and 110d. Hole-transporting materials useful in hole-transporting layer 122 are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel, et al. in U.S. Pat. No. 3,180,730. Other suitable triarylamines substituted with one or more vinyl radicals or at least one active hydrogen-containing group are disclosed by Brantley, et al. in U.S. Pat. Nos. 3,567,450 and 3,658,520.

A more preferred class of aromatic tertiary amines is those, which include at least two aromatic tertiary amine moieties as described in U.S. Pat. Nos. 4,720,432 and 5,061,569. Such compounds include those represented by structural Formula A

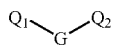

wherein:
Q$_1$ and Q$_2$ are independently selected aromatic tertiary amine moieties; and
G is a linking group such as an arylene, cycloalkylene, or alkylene group of a carbon to carbon bond.

In one embodiment, at least one of Q$_1$ or Q$_2$ contains a polycyclic fused ring structure, e.g., a naphthalene moiety. When G is an aryl group, it is conveniently a phenylene, biphenylene, or naphthalene moiety.

A useful class of triarylamines satisfying structural Formula A and containing two triarylamine moieties is represented by structural Formula B

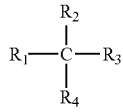

where:
R$_1$ and R$_2$ each independently represent a hydrogen atom, an aryl group, or an alkyl group or R$_1$ and R$_2$ together represent the atoms completing a cycloalkyl group; and
R$_3$ and R$_4$ each independently represent an aryl group, which is in turn substituted with a diaryl substituted amino group, as indicated by structural Formula C

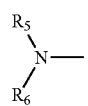

wherein R$_5$ and R$_6$ are independently selected aryl groups. In one embodiment, at least one of R$_5$ or R$_6$ contains a polycyclic fused ring structure, e.g., a naphthalene.

Another class of aromatic tertiary amines is the tetraaryldiamines. Desirable tetraaryldiamines include two diarylamino groups, such as indicated by Formula C, linked through an arylene group. Useful tetraaryldiamines include those represented by Formula D

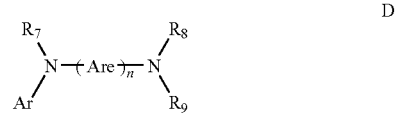

wherein:
each Are is an independently selected arylene group, such as a phenylene or anthracene moiety;
n is an integer of from 1 to 4; and
Ar, R$_7$, R$_8$, and R$_9$ are independently selected aryl groups.
In a typical embodiment, at least one of Ar, R$_7$, R$_8$, and R$_9$ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halides such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms, e.g. cyclopentyl, cyclohexyl, and cycloheptyl ring structures. The aryl and arylene moieties are typically phenyl and phenylene moieties.

The hole-transporting layer in an OLED device can be formed of a single or a mixture of aromatic tertiary amine compounds. Specifically, one can employ a triarylamine, such as a triarylamine satisfying the Formula (B), in combination with a tetraaryldiamine, such as indicated by Formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane;
1,1-Bis(4-di-p-tolylaminophenyl)-4-phenylcyclohexane;
4,4'-Bis(diphenylamino)quaterphenyl;
Bis(4-dimethylamino-2-methylphenyl)-phenylmethane;
Tri(p-tolyl)amine;
4-(di-p-tolylamino)-4'-[4'-(di-p-tolylamino)-1-styryl]stilbene;
N,N,N',N'-Tetra-p-tolyl-4,4'-diaminobiphenyl;
N,N,N',N'-Tetraphenyl-4,4'-diaminobiphenyl;
N-Phenylcarbazole;
Poly(N-vinylcarbazole);
N,N'-di-1-naphthalenyl-N,N'-diphenyl-4,4'-diaminobiphenyl;
4,4'-Bis[N-(1-naphthyl)-N-phenylamino]biphenyl (NPB);
4,4'-Bis[N-(1-naphthyl)-N-(2-naphthyl)amino]biphenyl (TNB);
4,4"-Bis[N-(1-naphthyl)-N-phenylamino]-p-terphenyl;
4,4'-Bis[N-(2-naphthyl)-N-phenylamino]biphenyl;
4,4'-Bis[N-(3-acenaphthenyl)-N-phenylamino]biphenyl;
1,5-Bis[N-(1-naphthyl)-N-phenylamino]naphthalene;
4,4'-Bis[N-(9-anthryl)-N-phenylamino]biphenyl;
4,4"-Bis[N-(1-anthryl)-N-phenylamino]p-terphenyl;
4,4'-Bis[N-(2-phenanthryl)-N-phenylamino]biphenyl;
4,4'-Bis[N-(8-fluoranthenyl)-N-phenylamino]biphenyl;
4,4'-Bis[N-(2-pyrenyl)-N-phenylamino]biphenyl;

4,4'-Bis[N-(2-naphthacenyl)-N-phenylamino]biphenyl;
4,4'-Bis[N-(2-perylenyl)-N-phenylamino]biphenyl;
4,4'-Bis[N-(1-coronenyl)-N-phenylamino]biphenyl;
2,6-Bis(di-p-tolylamino)naphthalene;
2,6-Bis[di-(1-naphthyl)amino]naphthalene;
2,6-Bis[N-(1-naphthyl)-N-(2-naphthyl)amino]naphthalene;
N,N,N',N'-Tetra(2-naphthyl)-4,4"-diamino-p-terphenyl;
4,4'-Bis{N-phenyl-N-[4-(1-naphthyl)-phenyl]amino}biphenyl;
4,4'-Bis[N-phenyl-N-(2-pyrenyl)amino]biphenyl;
2,6-Bis[N,N-di(2-naphthyl)amino]fluorene; and
1,5-Bis[N-(1-naphthyl)-N-phenylamino]naphthalene.

Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light emitting layers 123a and 123c produce light in response to hole-electron recombination and are disposed over hole-transporting layer 122, although hole-transporting layer 122 is not required for the practice of this invention. Useful organic light emitting materials are well known. As more fully described in U.S. Pat. Nos. 4,769,292 and 5,935,721, each of the light emitting layers of the organic EL element includes a luminescent or fluorescent material where electroluminescence is produced as a result of electron-hole pair recombination in this region. Although light emitting layers can be comprised of a single material, they more commonly include a host material doped with a guest compound or dopant where light emission comes primarily from the dopant. The practice of this invention concerns such host/dopant light emitting layers and OLED devices.

It should be noted that the magenta light emitting layer 123a should emit within two distinct regions of the spectrum. In preferred embodiments, this light emitting layer will, therefore, be formed from two or more sub-layers. That is the magenta light emitting layer 123a will preferably be produced by providing two, or more, light emitting sub-layers to form the magenta light emitting layers. Such a device structure is similar structure and may use a subset of the materials that are used to construct the conventional white OLEDs. White-emitting devices are described, for example, in EP 1 187 235, EP 1 182 244, U.S. Pat. Nos. 5,683,823, 5,503,910, 5,405,709, 5,283,182, 6,627,333, 6,696,177, 6,720,092, U.S. Patent Application Publications 2002/0186214 A1, 2002/0025419 A1, 2004/0009367 A1 and U.S. patent application Ser. No. 10/882,834 filed Jan. 5, 2004 entitled "High Performance White Light-Emitting OLED Device" by Hatwar et al., the disclosures of which are incorporated herein by reference.

Light emitting layer 123a includes at least a first host, and light emitting layer 123c includes a second host. Any of the hosts can be the same material. Any of the hosts can comprise a single host material or a mixture of host materials. The dopant is selected to produce colored light having a particular spectrum. The dopant is typically chosen from highly fluorescent dyes, and is typically coated as 0.01 to 10% by weight into the host material. Light emitting layer 123a preferably includes a sub-layer that includes a light emitting material of a blue color and a sub-layer that includes a light emitting material of a red color, e.g. a sub-layer formed from blue and a sub-layer formed from red light emitting material. Light emitting layer 123c includes a light emitting material of a green color, e.g. green light emitting material. The practice of this invention is not restricted to this ordering of layers. For instance, light emitting layer 123a can include a sub-layer formed from a red light emitting material followed by a sub-layer formed from a blue light emitting material. The host materials in the light emitting layers can be an electron-transporting material, a hole-transporting material, or another material that supports hole-electron recombination. The dopant is typically chosen from highly fluorescent dyes, but phosphorescent compounds, e.g., transition metal complexes as described in WO 98/55561, WO 00/18851, WO 00/57676, and WO 00/70655 are also useful.

The host and emitting materials can be small nonpolymeric molecules or polymeric materials including polyfluorenes and polyvinylarylenes, e.g., poly(p-phenylenevinylene), PPV. When the host is a polymer, small molecule emitting materials can be molecularly dispersed into a polymeric host, or the emitting materials can be added by copolymerizing a minor constituent into a host polymer.

Desirable host materials are capable of forming a continuous film. The light emitting layer can contain more than one host material in order to improve the device's film morphology, electrical properties, light emission efficiency, and lifetime. The light emitting layer can contain a first host material that has effective hole-transporting properties, and a second host material that has effective electron-transporting properties.

An important relationship for choosing a dye as a dopant is the value of the optical bandgap, which is defined the energy difference between the emissive excited state and the ground state of the molecule and is approximately equal to the energy difference between the lowest unoccupied molecular orbital and the highest occupied molecular orbital of the molecule. For efficient energy transfer from the host material to the dopant molecule, or to prevent back-transfer of energy from the dopant to the host, a necessary condition is that the band gap of the dopant be smaller than that of the host material.

Host and emitting molecules known to be of use include, but are not limited to, those disclosed in U.S. Pat. Nos. 4,768,292, 5,141,671, 5,150,006, 5,151,629, 5,294,870, 5,405,709, 5,484,922, 5,593,788, 5,645,948, 5,683,823, 5,755,999, 5,928,802, 5,935,720, 5,935,721, 6,020,078, and 6,534,199.

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk, et al. in commonly assigned U.S. Pat. No. 6,194,119 and references cited therein.

Suitable host materials for phosphorescent emitters (including materials that emit from a triplet excited state, i.e. so-called "triplet emitters") should be selected so that the triplet exciton can be transferred efficiently from the host material to the phosphorescent material. For this transfer to occur, it is a highly desirable condition that the excited state energy of the phosphorescent material be lower than the difference in energy between the lowest triplet state and the ground state of the host. However, the band gap of the host should not be chosen so large as to cause an unacceptable increase in the drive voltage of the OLED. Suitable host materials are described in WO 00/70655 A2, WO 01/39234 A2, WO 01/93642 A1, WO 02/074015 A2, WO 02/15645 A1, and U.S. Patent Application Publication 2002/0117662 A1. Suitable hosts include certain aryl amines, triazoles, indoles and carbazole compounds. Examples of desirable hosts are 4,4'-N,N'-dicarbazole-biphenyl (CBP), 2,2'-dimethyl-4,4'-(N,N'-dicarbazole)-biphenyl, m-(N,N'-dicarbazole)benzene, and poly(N-vinylcarbazole), including their derivatives.

In addition to suitable hosts, an OLED device employing a phosphorescent material often requires at least one exciton- or hole-blocking layer to help confine the excitons or electron-hole recombination centers to the light emitting layer comprising the host and phosphorescent material. In one embodiment, such a blocking layer would be placed between a phosphorescent light emitting layer and the cathode, and in contact with the phosphorescent light emitting layer. The ionization potential of the blocking layer should be such that there is an energy barrier for hole migration from the host into the electron-transporting layer (or the metal-doped organic layer), while the electron affinity should be such that electrons pass more readily from the electron-transporting layer (or the metal-doped organic layer) into the light emitting layer comprising host and phosphorescent material. It is further desired, but not absolutely required, that the triplet energy of the blocking material be greater than that of the phosphorescent material. Suitable hole-blocking materials are described in WO 00/70655 A2 and WO 01/93642 A1. Two examples of useful materials are bathocuproine (BCP) and bis(2-methyl-8-quinolinolato)(4-phenylphenolato)-Aluminum(III) (BAlQ). Metal complexes other than Balq are also known to block holes and excitons as described in U.S. Patent Application Publication 2003/0068528 A1. U.S. Patent Application Publication 2003/0175553 A1 describes the use of fac-tris(1-phenylpyrazolato-N,C$^2$)iridium(III) (Irppz) in an electron/exciton blocking layer.

Light emitting layer 123a includes a host material, or mixture of hosts, and a light emitting material. In one embodiment, the host material is one or more electron-transporting materials or one or more tetracene derivatives. Electron-transporting materials useful as host materials including metal complexes of 8-hydroxyquinoline and similar derivatives (Formula E) constitute one class of host compounds useful in light emitting layer 123a

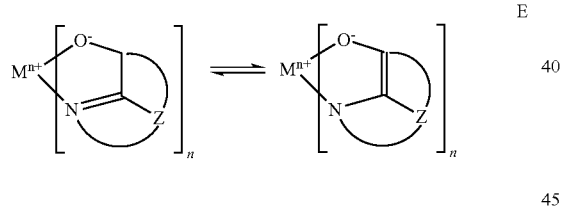

E wherein:
M represents a metal;
n is an integer of from 1 to 3; and
Z independently in each occurrence represents the atoms completing a nucleus having at least two fused aromatic rings.

From the foregoing it is apparent that the metal can be monovalent, divalent, or trivalent metal. The metal can, for example, be an alkali metal, such as lithium, sodium, or potassium; an alkaline earth metal, such as magnesium or calcium; or an earth metal, such as boron or aluminum. Generally, any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is typically maintained at 18 or less.

Illustrative of useful chelated oxinoid compounds are the following:

CO-1: Aluminum trisoxine [alias, tris(8-quinolinolato)aluminum(III)];
CO-2: Magnesium bisoxine [alias, bis(8-quinolinolato)magnesium(II)];
CO-3: Bis[benzo {f}-8-quinolinolato]zinc (II);
CO-4: Bis(2-methyl-8-quinolinolato)aluminum(III)-μ-oxo-bis(2-methyl-8-quinolinolato) aluminum(III);
CO-5: Indium trisoxine [alias, tris(8-quinolinolato)indium];
CO-6: Aluminum tris(5-methyloxine) [alias, tris(5-methyl-8-quinolinolato) aluminum(III)];
CO-7: Lithium oxine [alias, (8-quinolinolato)lithium(I)];
CO-8: Gallium oxine [alias, tris(8-quinolinolato)gallium (III)]; and
CO-9: Zirconium oxine [alias, tetra(8-quinolinolato)zirconium(IV)].

Examples of tetracene derivatives useful as hosts or co-hosts in light emitting layer 123a are:

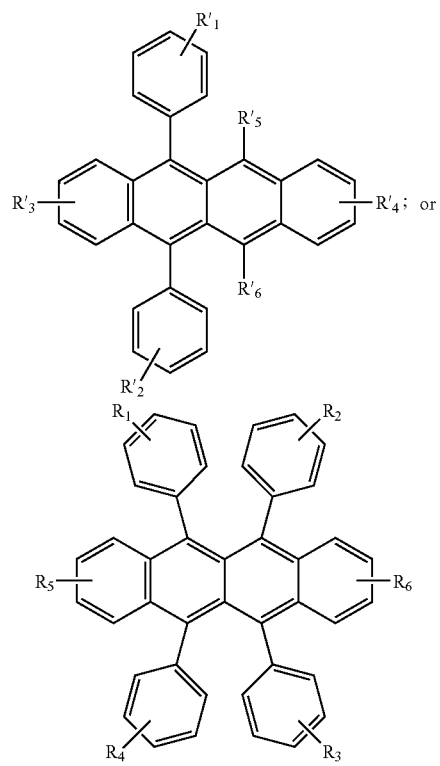

wherein $R_1$-$R_6$ represent one or more substituents on each ring and where each substituent is individually selected from one of the following:
Category 1: hydrogen, or alkyl of from 1 to 24 carbon atoms;
Category 2: aryl or substituted aryl of from 5 to 20 carbon atoms;
Category 3: hydrocarbon containing 4 to 24 carbon atoms, completing a fused aromatic ring or ring system;
Category 4: heteroaryl or substituted heteroaryl of from 5 to 24 carbon atoms such as thiazolyl, furyl, thienyl, pyridyl, quinolinyl or other heterocyclic systems, which are bonded via a single bond, or complete a fused heteroaromatic ring system;

Category 5: alkoxylamino, alkylamino, or arylamino of from 1 to 24 carbon atoms; or Category 6: fluoro, chloro, bromo or cyano.

In a preferred embodiment, the host material can include a mixture of one or more tetracene derivatives, and one or more electron-transporting materials.

In the preferred embodiment, the light emitting material in light emitting layer 123a has a peak emission in the red portion of the visible spectrum, and can include a red or red-orange light emitting dopant. A suitable light emitting red or red-orange dopant can include a diindenoperylene compound of the following structure:

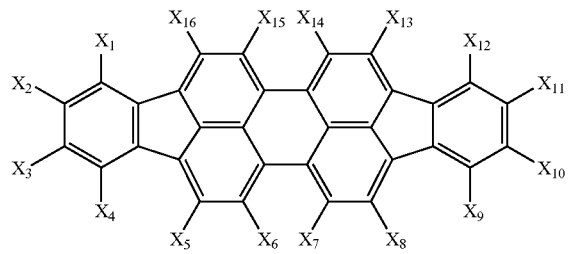

wherein $X_1$-$X_{16}$ are independently selected as hydro or substituents that provide red luminescence.

A particularly preferred diindenoperylene dopant is dibenzo{[f,f']-4,4'7,7'-tetraphenyl]diindeno-[1,2,3-cd:1',2',3'-lm]perylene (TPDBP below)

Other red or red-orange dopants useful in the present invention belong to the DCM class of dyes represented by

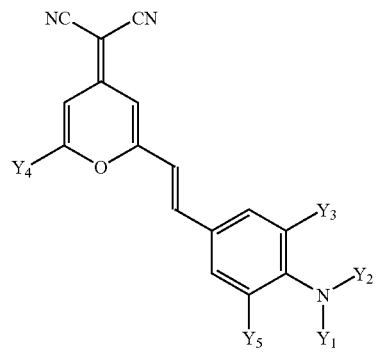

wherein:

$Y_1$-$Y_5$ represent one or more groups independently selected from hydro, alkyl, substituted alkyl, aryl, or substituted aryl; and $Y_1$-$Y_5$ independently include acyclic groups or are joined pairwise to form one or more fused rings, provided that $Y_3$ and $Y_5$ do not together form a fused ring.

In a useful and convenient embodiment that provides red-orange luminescence, $Y_1$-$Y_5$ are selected independently from hydro, alkyl and aryl. A preferred DCM dopant is DCJTB shown below

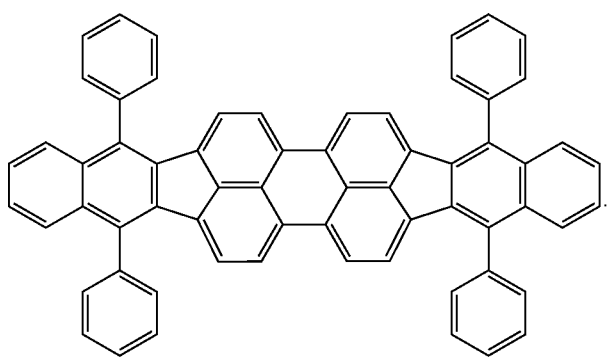

TPDBP

DCJTB

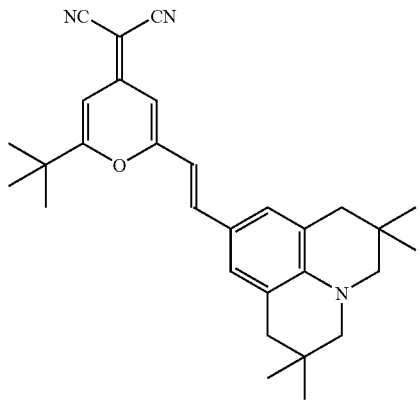

A useful red or red-orange dopant can also be a mixture of compounds that would also be red or red-orange dopants individually.

Additionally, light emitting layer 123a includes a host material, or mixture of hosts, and a light emitting material that has a peak emission in the blue to blue-green portion of the visible spectrum. In one embodiment, the host material is one or more anthracene or mono-anthracene derivatives. Derivatives of 9,10-di-(2-naphthyl)anthracene (Formula F) constitute one class of hosts useful in light emitting layer 123a

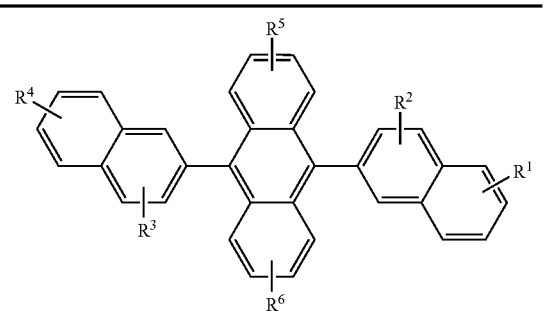

wherein:
$R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl; pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Benzazole derivatives (Formula G) constitute another class of hosts useful in light emitting layer 123a

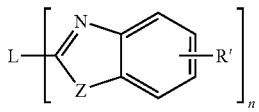

wherein:
n is an integer of 3 to 8;
Z is O, NR or S;
R' is hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and
L is a linkage unit including alkyl, aryl, substituted alkyl, or substituted aryl, which conjugately or unconjugately connects the multiple benzazoles together.

An example of a useful benzazole is 2, 2', 2"-(1,3,5-phenylene)-tris[1-phenyl-1H-benzimidazole].

It has been found in commonly assigned U.S. patent application Ser. No. 10/693,121 filed Oct. 24, 2003 by Lelia Cosimbescu, et al., entitled "Electroluminescent Device With Anthracene Derivative Host", the disclosure of which is herein incorporated by reference, that certain unsymmetrical anthracenes are extremely useful in OLED devices that exhibit high efficiencies. These compounds have been found to be particularly useful in blue light emitting layers of OLED devices that produce blue, blue-green, or green light. Blue or blue-green light emitting layer 123a can include a mono-anthracene derivative of Formula (I) as a host material

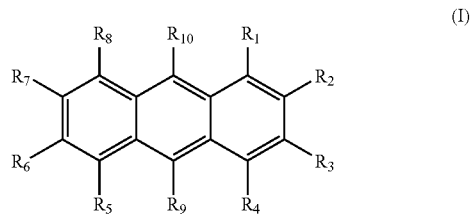

wherein:
$R_1$-$R_8$ are H; and
$R_9$ is a naphthyl group containing no fused rings with aliphatic carbon ring members; provided that $R_9$ and $R_{10}$ are not the same, and are free of amines and sulfur compounds. Suitably, $R_9$ is a substituted naphthyl group with one or more further fused rings such that it forms a fused aromatic ring system, including a phenanthryl, pyrenyl, fluoranthene, perylene, or substituted with one or more substituents including fluorine, cyano group, hydroxy, alkyl, alkoxy, aryloxy, aryl, a heterocyclic oxy group, carboxy, trimethylsilyl group, or an unsubstituted naphthyl group of two fused rings. Conveniently, $R_9$ is 2-naphthyl, or 1-naphthyl substituted or unsubstituted in the para position; and
$R_{10}$ is a biphenyl group having no fused rings with aliphatic carbon ring members. Suitably $R_{10}$ is a substituted biphenyl group, such that it forms a fused aromatic ring system including but not limited to a naphthyl, phenanthryl, perylene, or substituted with one or more substituents including fluorine, cyano group, hydroxy, alkyl, alkoxy, aryloxy, aryl, a heterocyclic oxy group, carboxy, trimethylsilyl group, or an unsubstituted biphenyl group. Conveniently, $R_{10}$ is 4-biphenyl, 3-biphenyl unsubstituted or substituted with another phenyl ring without fused rings to form a terphenyl ring system, or 2-biphenyl. Particularly useful is 9-(2-naphthyl)-10-(4-biphenyl)anthracene.

Some examples of useful mono-anthracene host materials for use in light emitting layer 123a include:

Host-1

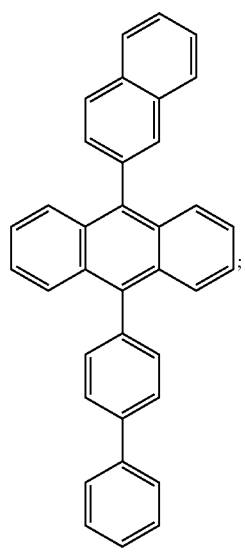

Host-2

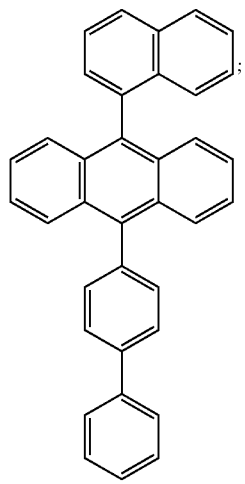

Host-3

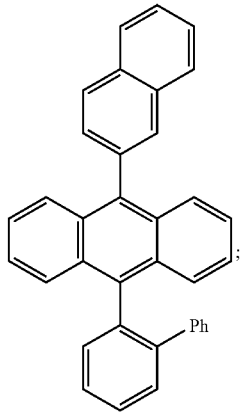

Host-4

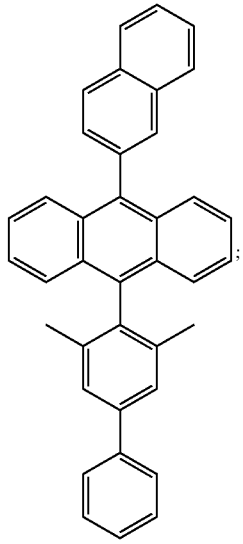

Host-5

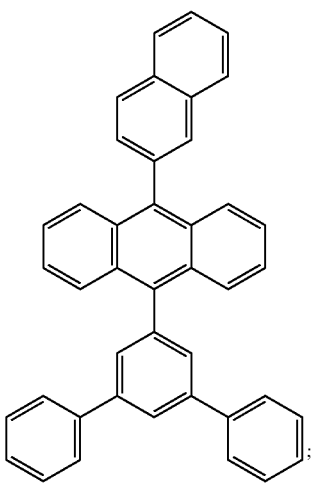

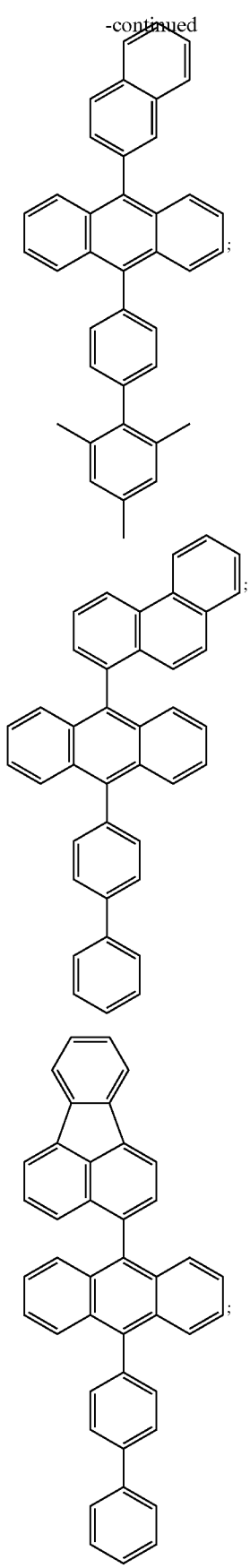
Host-6
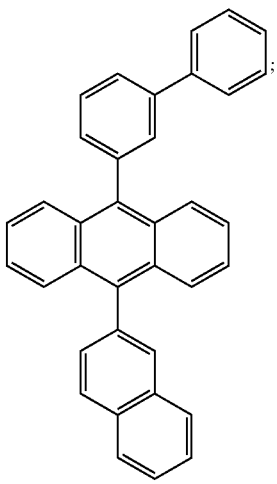
Host-7
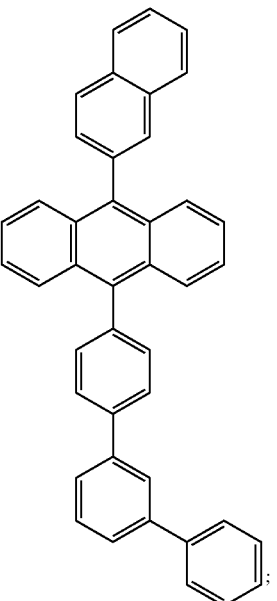
Host-8
Host-9
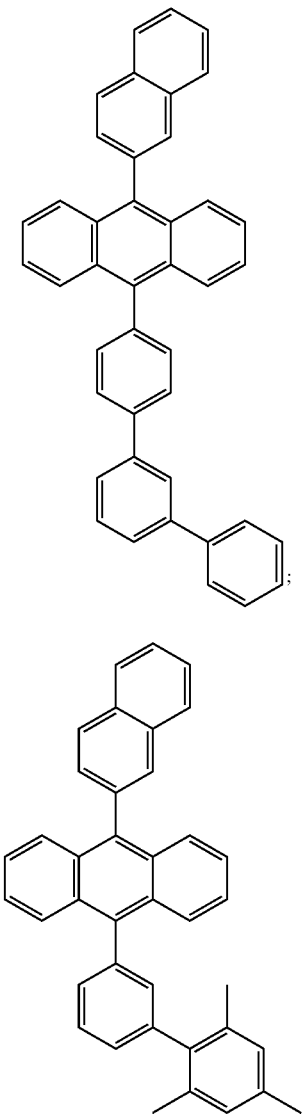
Host-10
Host-11

Host-12
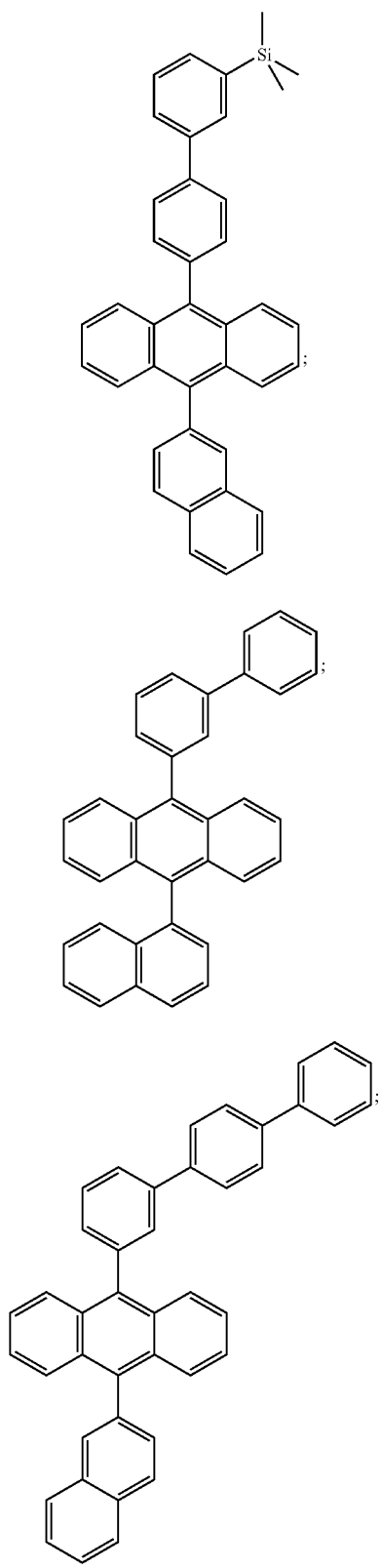
Host-13
Host-14
Host-15
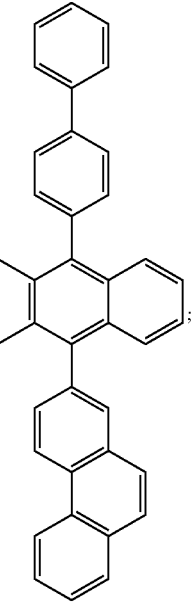
Host-16
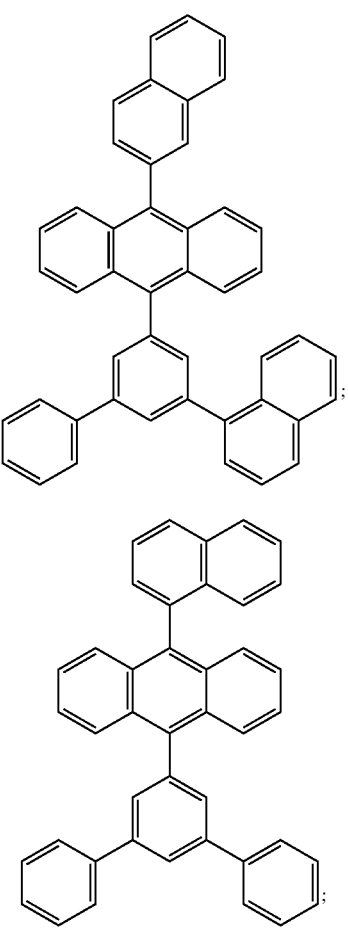
Host-17

Host-18
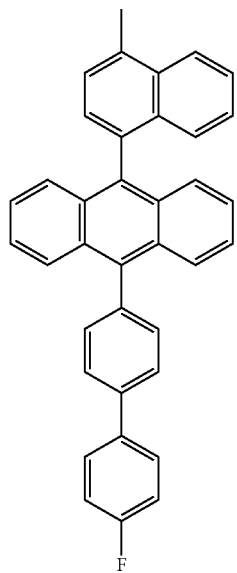
Host-19
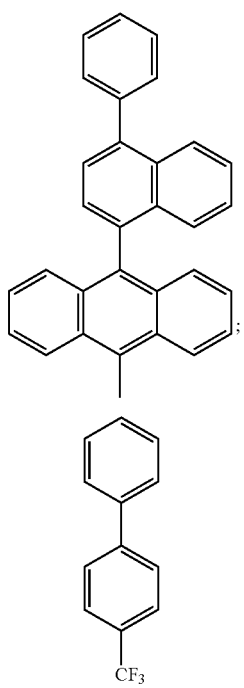
Host-20
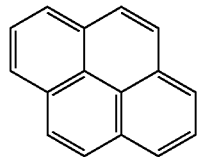
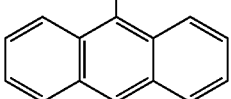
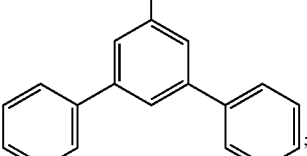
Host-21
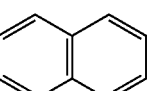
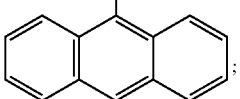
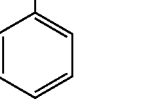
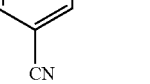
Host-22
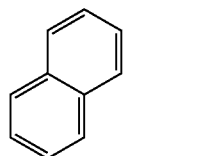
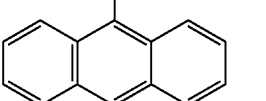
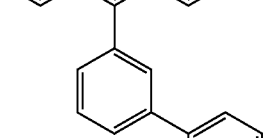
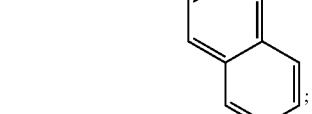

-continued

Host-23

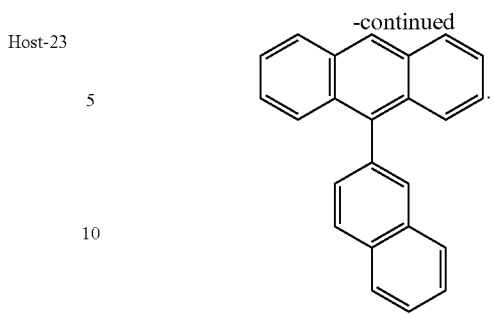

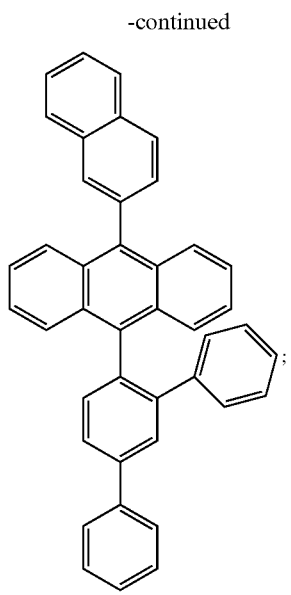

Particularly useful is 9-(2-naphthyl)-10-(4-biphenyl)anthracene (Host-1).

In a preferred embodiment, the host material in light emitting layer 123a can include a mixture of one or more anthracene or mono-anthracene derivatives mentioned above, and one or more aromatic amine derivatives. The aromatic amine derivative in light emitting layer 123a can be any such amine that has hole-transporting properties, and can be selected from the same potential hole-transporting materials as in hole-transporting layer 122. Particularly useful is 4,4'-Bis[N-(1-naphthyl)-N-phenylamino]biphenyl (NPB).

In the preferred embodiment, the blue light emitting material in light emitting layer 123a has a peak emission in the blue portion of the visible spectrum, and can include blue light emitting dopants including perylene or derivatives thereof, blue-emitting derivatives of distyrylbenzene or a distyrylbiphenyl that have one or more aryl amine substituents, or a compound of the structure Host-24

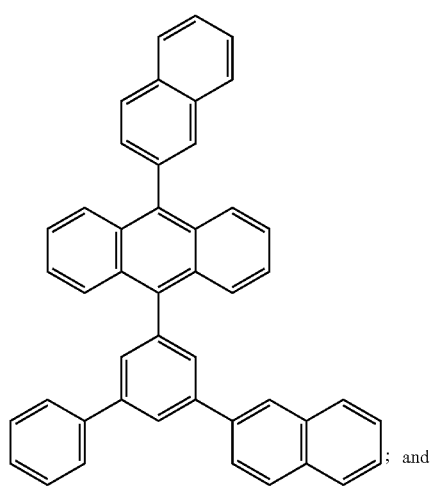

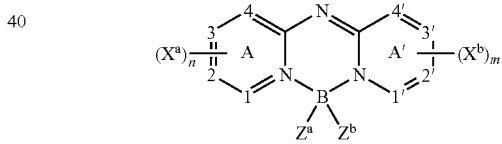

wherein:

Host-25

A and A' represent independent azine ring systems corresponding to 6-membered aromatic ring systems containing at least one nitrogen;

$(X^a)_n$ and $(X^b)_m$ represent one or more independently selected substituents and include acyclic substituents or are joined to form a ring fused to A or A';

m and n are independently 0 to 4;

$Z^a$ and $Z^b$ are independently selected substituents;

1, 2, 3, 4, 1', 2', 3', and 4' are independently selected as either carbon or nitrogen atoms; and provided that $X^a$, $X^b$, $Z^a$, and $Z^b$, 1, 2, 3, 4, 1', 2', 3', and 4' are selected to provide blue luminescence.

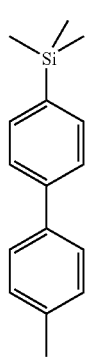

Some examples of the above class of dopants include the following:

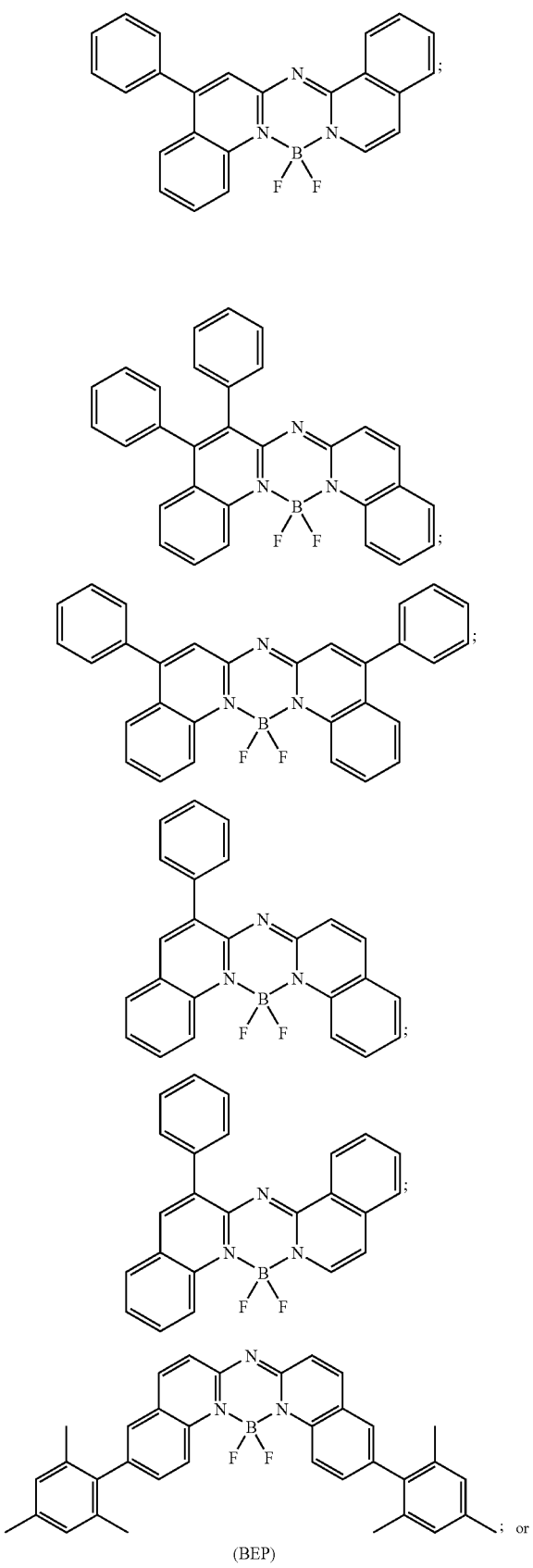

(BEP)

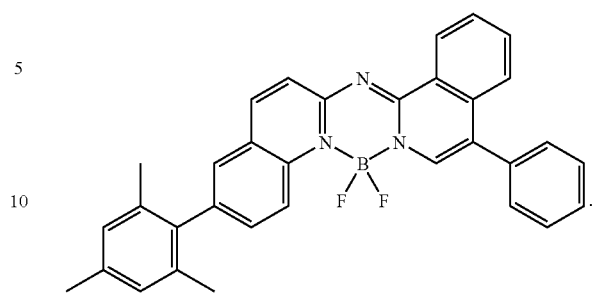

Preferred blue dopants are BEP and tetra-t-butylperylene (TBP). A useful blue dopant can also be a mixture of compounds that would also be blue dopants individually.

In another preferred embodiment, the blue light emitting material in light emitting layer 123a has a peak emission in the blue-green portion of the visible spectrum, and can include blue-green emitting derivatives of such distyrylarenes as distyrylbenzene and distyrylbiphenyl, including compounds described in U.S. Pat. No. 5,121,029. Among derivatives of distyrylarenes that provide blue or blue-green luminescence, particularly useful are those substituted with diarylamino groups, also known as distyrylamines. Examples include bis[2-[4-[N,N-diarylamino]phenyl]vinyl]-benzenes of the general structure N1 shown below:

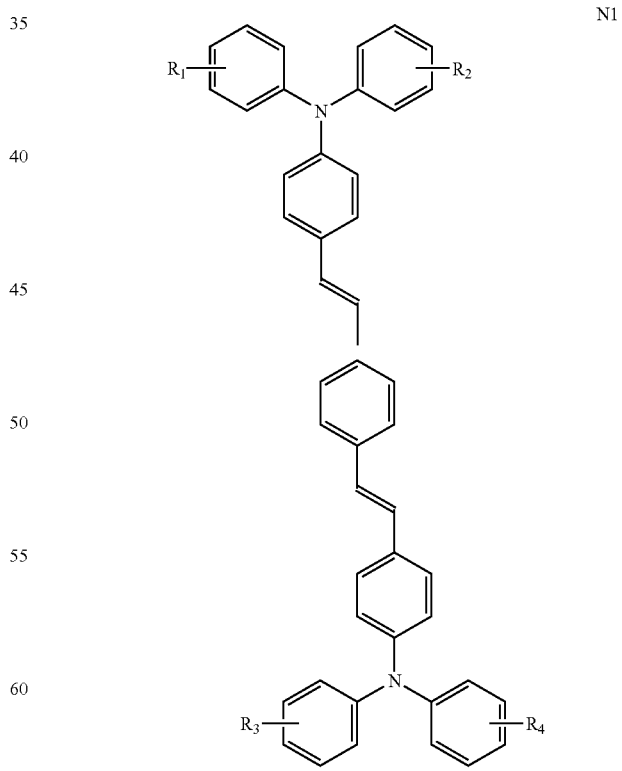

and bis[2-[4-[N,N-diarylamino]phenyl]vinyl]biphenyls of the general structure N2 shown below:

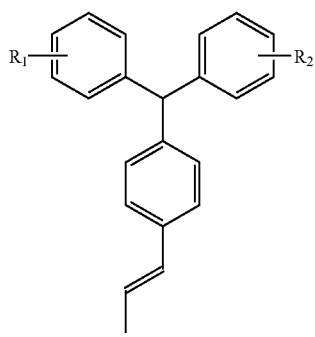

N2

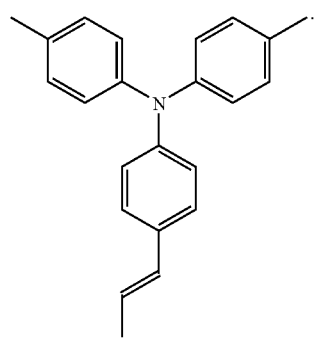

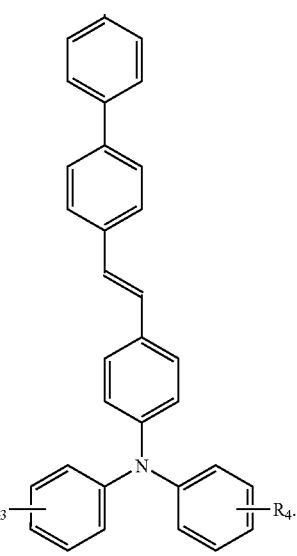

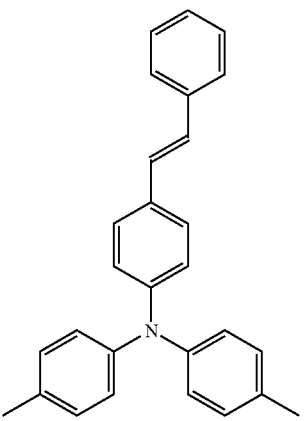

In a useful embodiment of the invention, light emitting layer 123c includes a blue-green dopant of Formula (3)

Formula (3)

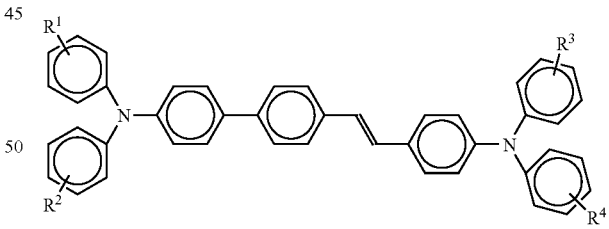

In Formulas N1 and N2, $R_1$-$R_4$ can be the same or different, and individually represent one or more substituents such as alkyl, aryl, fused aryl, halo, or cyano. In a preferred embodiment, $R_1$-$R_4$ are individually alkyl groups, each containing from one to about ten carbon atoms. A particularly useful blue-green dopant of this class is 1,4-bis[2-[4-[N,N-di(p-tolyl)amino]phenyl]vinyl]benzene (BDTAPVB)

wherein $R^1$ through $R^4$ can be the same or different and individually represent hydrogen or one or more substituents, for example, alkyl groups, such as methyl groups, alkoxy groups, such as methoxy, aryl groups, such as phenyl, or aryloxy groups, such as phenoxy.

Particularly useful embodiments of the blue-green emissive dopants of light emitting layer 123c are shown in Formula (4-1) through Formula (4-5)

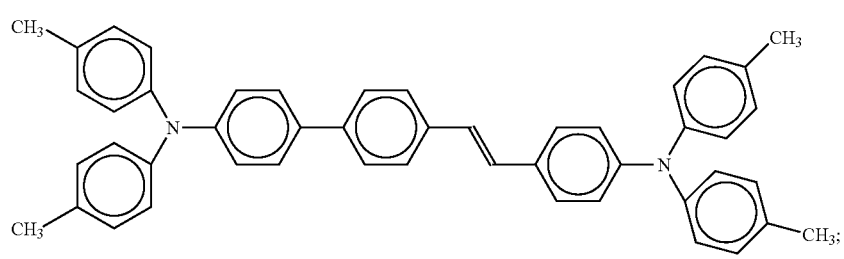
Formula (4-1)
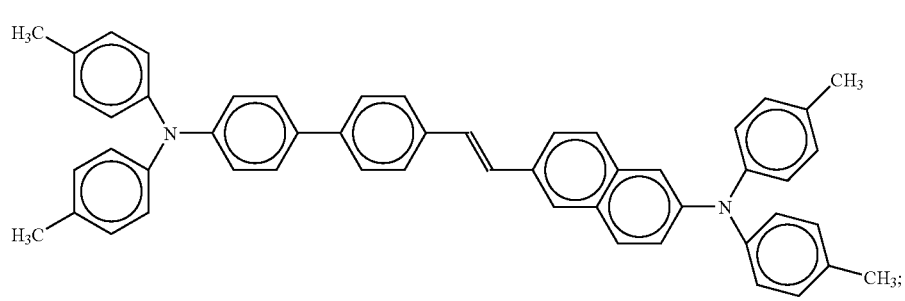
Formula (4-2)
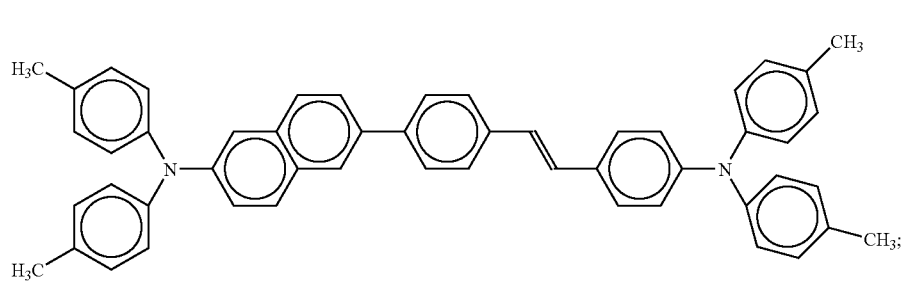
Formula (4-3)
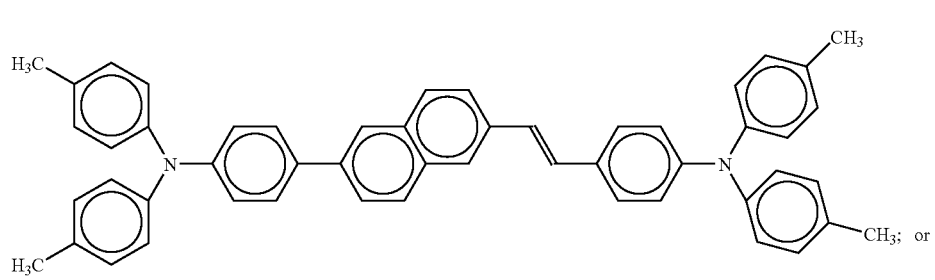
Formula (4-4); or
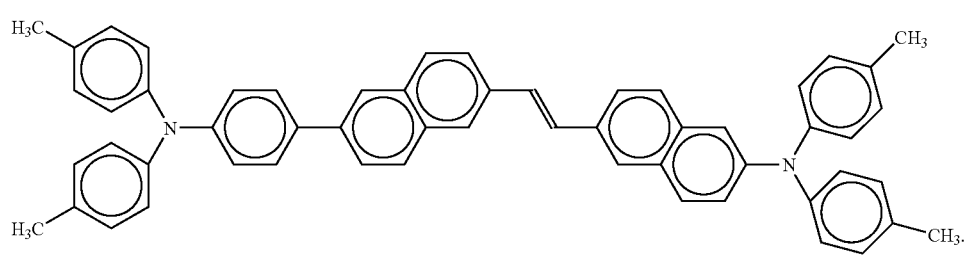
Formula (4-5)

In the preferred embodiment, the light emitting material in light emitting layer 123c has a peak emission in the green portion of the visible spectrum, and can include a green, blue-green or yellow-orange light emitting material. However, in a particularly preferred embodiment, the light emitting material will emit solely within the green portion of the visible spectrum such that color filtering is not required. Useful green light-emitting materials can include a quinacridone compound of the following structure:

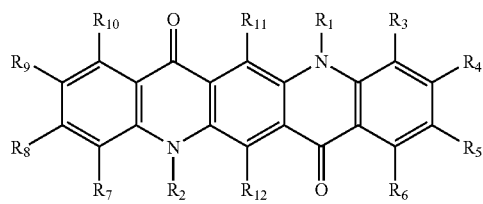

D1 wherein substituent groups $R_1$ and $R_2$ are independently alkyl, alkoxyl, aryl, or heteroaryl; and substituent groups $R_3$ through $R_{12}$ are independently hydrogen, alkyl, alkoxyl, halogen, aryl, or heteroaryl, and adjacent substituent groups $R_3$ through $R_{10}$ can optionally be connected to form one or more ring systems, including fused aromatic and fused heteroaromatic rings, between 510 nm and 540 nm, and a full width at half maximum of 40 nm or less. Alkyl, alkoxyl, aryl, heteroaryl, fused aromatic ring and fused heteroaromatic ring substituent groups are further substituted. Conveniently, $R_1$ and $R_2$ are aryl, and $R_2$ through $R_{12}$ are hydrogen, or substituent groups that are more electron withdrawing than methyl. Some examples of useful quinacridones include those disclosed in U.S. Pat. No. 5,593,788 and in U.S. Patent Publication 2004/0001969 A1.

Examples of useful quinacridone green dopants include:

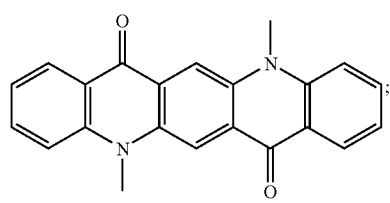

D2

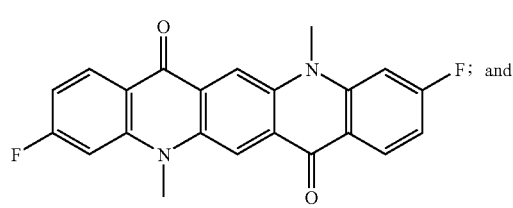

D3

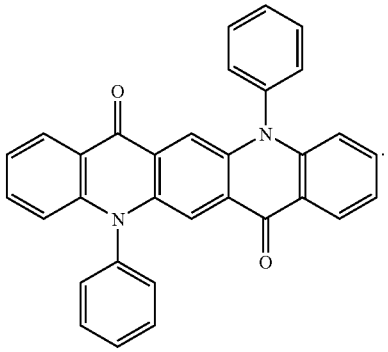

D4

The green light-emitting materials can include a coumarin compound of the following structure:

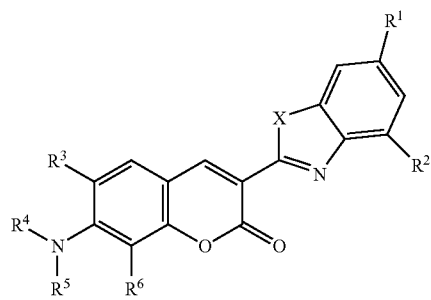

E1 wherein:
X is O or S, $R^1$, $R^2$, $R^3$ and $R^6$ can individually be hydrogen, alkyl, or aryl;
$R^4$ and $R^5$ can individually be alkyl or aryl, or where either $R^3$ and $R^4$; or
$R^5$ and $R^6$, or both together represent the atoms completing a cycloalkyl group.

Examples of useful coumarin green dopants include:

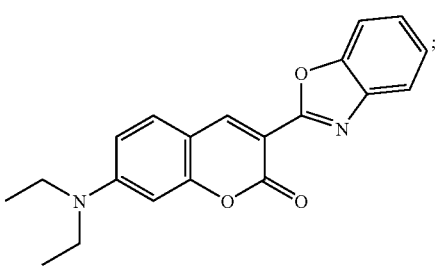

E2

-continued

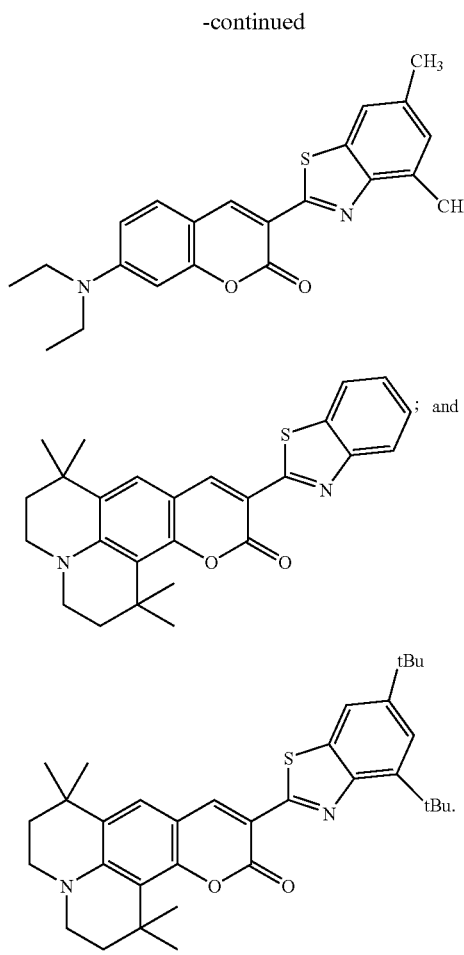

Although not always necessary, it is often useful that an organic layer is formed over light emitting layers 123a and 123c, wherein the organic layer includes an electron-transporting material, e.g. electron-transporting layer 124. Preferred electron-transporting materials for use in electron-transporting layer 124 are metal chelated oxinoid compounds, including chelates of oxine itself (also commonly referred to as 8-quinolinol or 8-hydroxyquinoline). Such compounds help to inject and transport electrons and both exhibit high levels of performance and are readily fabricated in the form of thin films. Exemplary of contemplated oxinoid compounds are those satisfying structural Formula E

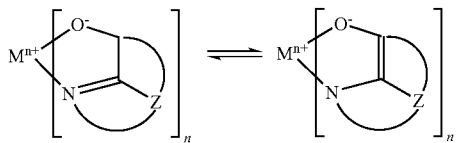

wherein:
M represents a metal;
n is an integer of from 1 to 3; and
Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as beryllium, magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is typically maintained at 18 or less.

Illustrative of useful chelated oxinoid compounds are the following:
CO-1: Aluminum trisoxine [alias, tris(8-quinolinolato)aluminum(III)];
CO-2: Magnesium bisoxine [alias, bis(8-quinolinolato) magnesium(II)];
CO-3: Bis[benzo {f}-8-quinolinolato]zinc (II);
CO-4: Bis(2-methyl-8-quinolinolato)aluminum(III)-µ-oxo-bis(2-methyl-8-quinolinolato) aluminum(III);
CO-5: Indium trisoxine [alias, tris(8-quinolinolato)indium];
CO-6: Aluminum tris(5-methyloxine) [alias, tris(5-methyl-8-quinolinolato) aluminum(III)];
CO-7: Lithium oxine [alias, (8-quinolinolato)lithium(I)];
CO-8: Gallium oxine [alias, tris(8-quinolinolato)gallium (III)]; and
CO-9: Zirconium oxine [alias, tetra(8-quinolinolato)zirconium(IV)].

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula G are also useful electron-transporting materials.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1-4, H. S. Nalwa, ed., John Wiley and Sons, Chichester (1997).

An electron-injecting layer (not shown) can also be present between the cathode and the electron-transporting layer. Examples of electron-injecting materials include alkali or alkaline earth metals, alkali halide salts, such as LiF mentioned above, or alkali or alkaline earth metal doped organic layers.

Desired organic materials for the hole-transporting layer 122, light emitting layers 123a and 123c, and electron-transporting layer 124 can be deposited and patterned by any one or more of several methods known in the art. For example, organic materials can be deposited by thermal evaporation from a heated source and pattern achieved by selectively blocking deposition by use of a shadow masking structure. Alternately, the materials can first be deposited onto a donor sheet, which is then placed in contact or in proximity to the display substrate and the materials can be selectively transferred by writing with a laser. Alternately, some materials can be dissolved in a solvent and then selectively deposited on the substrate in the desired location by placing droplets of the solution by drop ejecting apparatus such as an ink jet head.

The device can further include an encapsulation means (not shown) for preventing moisture from the environment from degrading the device as is known in the art. The encapsulation means can be a glass or metal cover hermetically sealed to the substrate or can be a thin film of moisture impermeable material coated over the pixels. The encapsulation means can further include a desiccant for absorbing moisture.

The invention has been described in detail with particular reference to certain preferred embodiments thereof, but it will be understood that variations and modifications can be effected within the spirit and scope of the invention.

PARTS LIST

| | |
|---|---|
| 10 | pixel group |
| 11a | pixel |
| 11b | pixel |
| 11c | pixel |
| 11d | pixel |
| 12 | pixel group |
| 14 | pixel group |
| 100 | substrate |
| 110a | first electrode |
| 110b | first electrode |
| 110c | first electrode |
| 110d | first electrode |
| 122 | hole-transporting layer |
| 123a | magenta light emitting layer |
| 123c | green light emitting layer |
| 124 | electron-transporting layer |
| 130 | second electrode |
| 140a | color filter |
| 140b | color filter |
| 140c | color filter |
| 160 | spectral transmittance curve |
| 162 | spectral transmittance curve |
| 170 | relative spectral emission curve |
| 172 | spectral transmittance curve |
| 174 | spectral transmittance curve |
| 210a | external light emission |
| 210b | external light emission |
| 210c | external light emission |
| 210d | external light emission |
| 220a | internal light emission |
| 220b | internal light emission |
| 220c | internal light emission |
| 220d | internal light emission |

The invention claimed is:

1. An OLED display having at least red, green, and blue colored pixels, comprising:
   a) a magenta light emitting layer provided over a substrate for red and blue pixels and a green light emitting layer provided over the substrate for producing at least a green pixel; and
   b) first and second color filters in operative relationship with the magenta light-emitting layer to respectively produce red and blue pixels; and
   wherein the magenta and green light emitting layers overlap in a region corresponding to a white pixel.

2. The OLED display according to claim 1, further including a third color filter that passes green light and absorbs light of other colors.

3. The OLED display according to claim 1, wherein the first light emitting layer is continuous between the red, blue and white pixels, and the second light emitting layer is continuous between the green and white pixels.

4. An OLED display having at least red, green, and blue colored pixels, comprising:
   a) a magenta light emitting layer provided over a substrate for red and blue pixels and a green light emitting layer provided over the substrate for producing at least a green pixel; and
   b) first and second color filters in operative relationship with the magenta light-emitting layer to respectively produce red and blue pixels; and
   wherein the magenta and green light emitting layers overlap in a region to produce white light, and the first and second color filters receive the light corresponding to a white pixel to produce the red and blue pixels.

5. An OLED display having at least red, green, and blue colored pixels, comprising:
   a) a magenta light emitting layer provided over a substrate for red and blue pixels and a green light emitting layer provided over the substrate for producing at least a green pixel; and
   b) first and second color filters in operative relationship with the magenta light-emitting layer to respectively produce red and blue pixels; and
   wherein the magenta and green light emitting layers overlap in a region to produce white light, and a green color filter receives the light corresponding to a white pixel to produce the green pixel.

6. An OLED display having at least red, green, and blue colored pixels; comprising:
   a) a magenta light emitting layer provided over a substrate for red and blue pixels and a green light emitting layer provided over the substrate for producing at least a green pixel; and
   b) first and second color filters in operative relationship with the magenta light-emitting layer to respectively produce red and blue pixels; and
   wherein the green pixel produces unfiltered green light.

7. An OLED display having at least red, green, and blue colored pixels, comprising:
   a) a magenta light emitting layer provided over a substrate for red and blue pixels and a green light emitting layer provided over the substrate for producing at least a green pixel; and
   b) first and second color filters in operative relationship with the magenta light-emitting layer to respectively produce red and blue pixels; and
   wherein the first color filter passes red light and absorbs blue light.

8. An OLED display having at least red, green, and blue colored pixels, comprising:
   a) a magenta light emitting layer provided over a substrate for red and blue pixels and a green light emitting layer provided over the substrate for producing at least a green pixel; and
   b) first and second color filters in operative relationship with the magenta light-emitting layer to respectively produce red and blue pixels; and
   wherein the second color filter passes blue light and absorbs red light.

9. An OLED display having at least red, green, and blue colored pixels, comprising:
   a) a magenta light emitting layer provided over a substrate for red and blue pixels and a green light emitting layer provided over the substrate for producing at least a green pixel; and
   b) first and second color filters in operative relationship with the magenta light-emitting layer to respectively produce red and blue pixels; and
   wherein the light spectrum produced by the green light emitting layer has substantial spectral components corresponding to green and red light.

10. The OLED display according to claim 9, further including a third color filter tat passes green light and absorbs light of other colors.

11. An OLED display having at least red, green, and blue colored pixels, comprising:
  a) a magenta light emitting layer provided over a substrate for red and blue pixels and a green light emitting layer provided over the substrate for producing at least a green pixel; and
  b) first and second color filters in operative relationship with the magenta light-emitting layer to respectively produce red and blue pixels; and wherein the light spectrum produced by the green light emitting layer has substantial spectral components corresponding to green and blue light.

12. The OLED display according to claim 11, further including a third color filter passes green light and absorbs light of other colors.

* * * * *

UNITED STATES PATENT AND TRADEMARK OFFICE
CERTIFICATE OF CORRECTION

PATENT NO. : 7,602,119 B2
APPLICATION NO. : 11/315827
DATED : October 13, 2009
INVENTOR(S) : Michael E. Miller et al.

It is certified that error appears in the above-identified patent and that said Letters Patent is hereby corrected as shown below:

| | |
|---|---|
| Column 44, line 22 | In Claim 6, delete "pixels;" and insert --pixels,--, therefor. |
| Column 44, line 66 | In Claim 10, delete "tat" and insert --that--, therefor. |

Signed and Sealed this

Nineteenth Day of January, 2010

David J. Kappos
*Director of the United States Patent and Trademark Office*